(12) United States Patent
Kitada

(10) Patent No.: US 11,195,577 B2
(45) Date of Patent: Dec. 7, 2021

(54) SWITCH ELEMENT AND METHOD FOR MANUFACTURING SWITCH ELEMENT

(71) Applicant: FUJITSU LIMITED, Kawasaki (JP)

(72) Inventor: Hideki Kitada, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/077,346

(22) Filed: Oct. 22, 2020

(65) Prior Publication Data

US 2021/0151104 A1    May 20, 2021

(30) Foreign Application Priority Data

Nov. 15, 2019 (JP) .............................. JP2019-206984

(51) Int. Cl.
| | | |
|---|---|---|
| *G11C 13/00* | (2006.01) | |
| *H01L 27/24* | (2006.01) | |
| *H01L 45/00* | (2006.01) | |

(52) U.S. Cl.
CPC ...... *G11C 13/0007* (2013.01); *H01L 27/2418* (2013.01); *H01L 45/1233* (2013.01); *H01L 45/146* (2013.01); *H01L 45/1608* (2013.01)

(58) Field of Classification Search
None
See application file for complete search history.

(56) References Cited

U.S. PATENT DOCUMENTS

| 2008/0023696 A1* | 1/2008 | Yukawa | H01L 21/84 257/40 |
| 2008/0237798 A1* | 10/2008 | Lee | H01L 45/04 257/536 |
| 2016/0043141 A1* | 2/2016 | Nishihara | H01L 45/1675 257/4 |

FOREIGN PATENT DOCUMENTS

| JP | 2011-238875 A | 11/2011 |
| WO | 2008/001712 A1 | 1/2008 |

* cited by examiner

*Primary Examiner* — Tan T. Nguyen
(74) *Attorney, Agent, or Firm* — Westerman, Hattori, Daniels & Adrian, LLP

(57) ABSTRACT

A switch element includes a first wiring line that is provided in a first insulating film and extends in a first direction; a second wiring line that is provided in a second insulating film and extends in a second direction that intersects the first direction; an ion conductive layer sandwiched between the first wiring line and the second wiring line and directly in contact with the second wiring line in an intersection region where the first wiring line and the second wiring line intersect, and enabled to conduct metal ions supplied from the second wiring line; and a metal oxide film sandwiched between the first wiring line and the ion conductive layer.

14 Claims, 20 Drawing Sheets

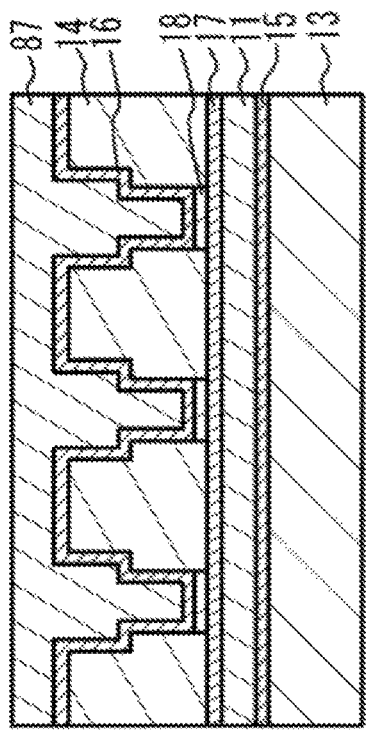
FIG. 12A
FIG. 12C
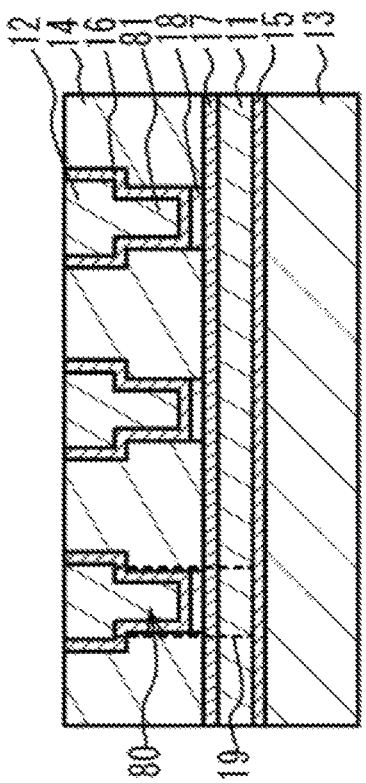
FIG. 12B
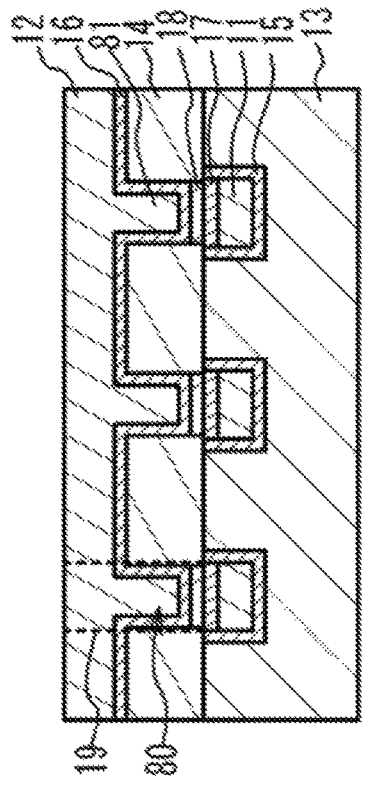
FIG. 12D

SWITCH ELEMENT AND METHOD FOR MANUFACTURING SWITCH ELEMENT

CROSS-REFERENCE TO RELATED APPLICATION

This application is based upon and claims the benefit of priority of the prior Japanese Patent Application No. 2019-206984, filed on Nov. 15, 2019, the entire contents of which are incorporated herein by reference.

FIELD

The embodiments discussed herein are related to a switch element and a method for manufacturing the switch element.

BACKGROUND

A switch element is known in which an ion conductive layer enabled to conduct metal ions is sandwiched between a first electrode including a material enabled to supply metal ions and a second electrode including a material that does not supply metal ions. It is said that by applying a voltage between the first electrode and the second electrode, the metal ions of the first electrode are dissolved in the ion conductive layer and deposited as a metal to form a metal bridge connecting the first electrode and the second electrode together. Furthermore, a switch element is known in which a portion in contact with the ion conductive layer of the first electrode enabled to supply the metal ions is a metal oxide. It is said that the metal oxide is provided, whereby implantation speed is increased of the metal ions from the first electrode into the ion conductive layer. For example, International Publication Pamphlet No. WO 2008/001712, Japanese Laid-open Patent Publication No. 2011-238875, and the like are disclosed as related arts.

SUMMARY

According to an aspect of the embodiments, a switch element includes a first wiring line that is provided in a first insulating film and extends in a first direction; a second wiring line that is provided in a second insulating film and extends in a second direction that intersects the first direction; an ion conductive layer sandwiched between the first wiring line and the second wiring line and directly in contact with the second wiring line in an intersection region where the first wiring line and the second wiring line intersect, and enabled to conduct metal ions supplied from the second wiring line; and a metal oxide film sandwiched between the first wiring line and the ion conductive layer.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 12A to 12D are cross-sectional views (part 2) illustrating the method for manufacturing the switch element according to the first comparative example;

DESCRIPTION OF EMBODIMENTS

A crossbar switch is known in which a switch element is provided in a region where a first wiring line and a second wiring line intersect. In the crossbar switch, the switch element includes a resistance change element and a diode element. An ion conductive layer enabled to conduct metal ions is provided in an intersection region where the first wiring line and the second wiring line intersect. As a result, by applying a voltage between the first wiring line and the second wiring line, the metal ions of the first wiring line and/or the second wiring line are supplied to the ion conductive layer, a metal bridge is formed, and the switch may be caused to function as a resistance change element. Furthermore, by providing a metal oxide film between the first wiring line and the ion conductive layer, the switch may be caused to function as a diode element.

However, when the metal ions are supplied from the first wiring line to the ion conductive layer through the metal oxide film, the rectification characteristic may degrade of the diode element using the metal oxide film.

In view of the above, it is desirable to suppress the degradation of the rectification characteristic.

Hereinafter, embodiments will be described with reference to the drawings.

First Embodiment

Figure 1:
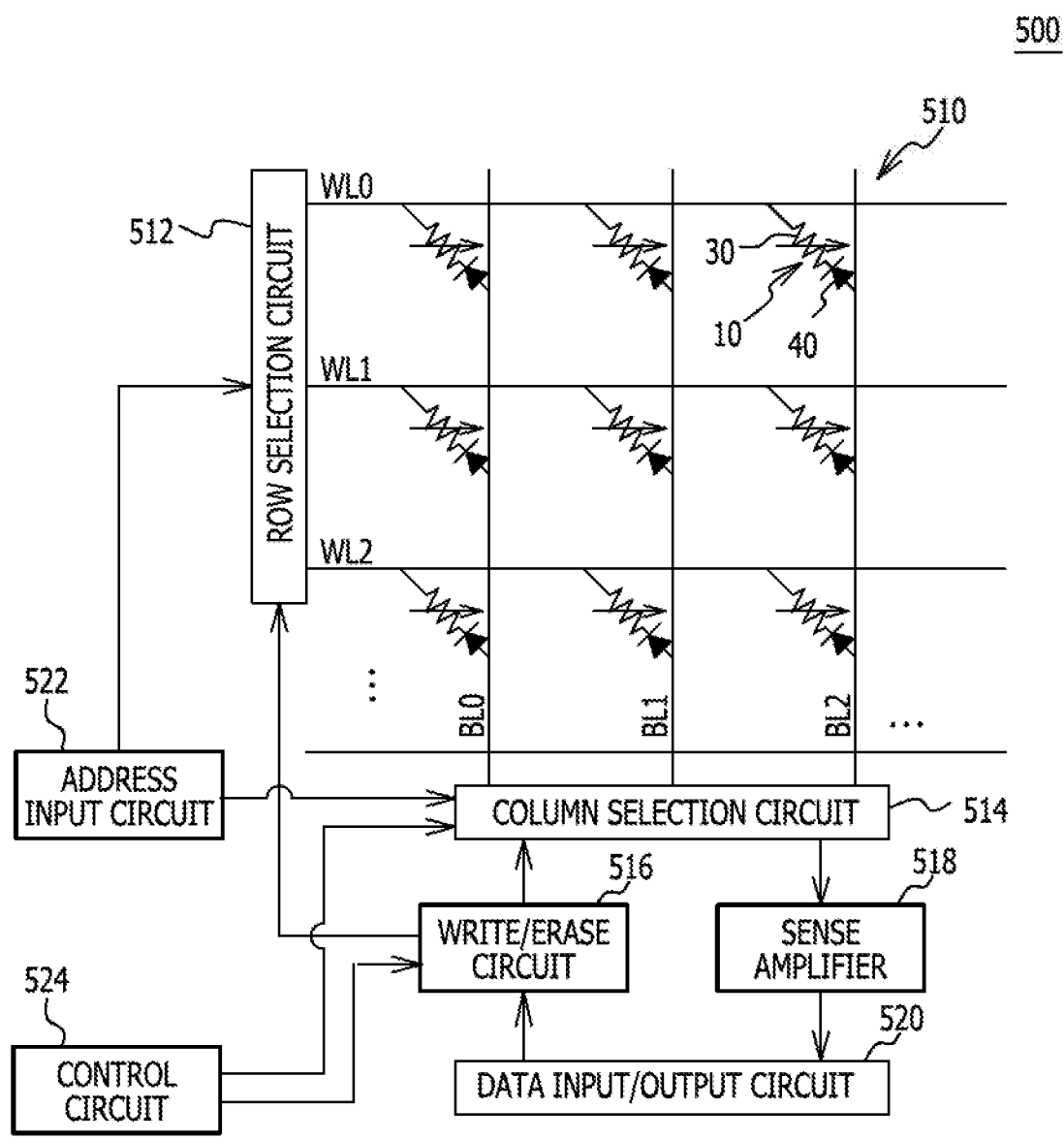
FIG. 1 is a block diagram illustrating an example of a structure of a storage device using a crossbar switch.

FIG. 1 is a block diagram illustrating an example of a structure of a storage device using a crossbar switch. As illustrated in FIG. 1, a storage device 500 includes a memory cell array 510, a row selection circuit 512, a column selection circuit 514, a write/erase circuit 516, a sense amplifier 518, and a data input/output circuit 520. Furthermore, the storage device 500 includes an address input circuit 522 that receives an address signal input from the outside, and a control circuit 524 that controls operation of the storage device 500 on the basis of a control signal input from the outside.

The memory cell array 510 includes a plurality of word lines WL0, WL1, WL2 • • • formed in parallel with each other, and a plurality of bit lines BL0, BL, BL2 • • • formed in parallel to each other to intersect the word lines WL0, WL1, WL2 • • • in a different level. Furthermore, the memory cell array 510 includes a plurality of switch elements 10 provided in a matrix corresponding to intersections of the word lines WL0, WL1, WL2 • • • and the bit lines BL0, BL1, BL2 • • •. The switch element 10 includes a resistance change element 30 and a diode element 40.

The address input circuit 522 receives an address signal from an external circuit, and on the basis of the address signal, outputs a row address signal to the row selection circuit 512 and outputs a column address signal to the column selection circuit 514. The address signal is a signal indicating an address of a specific switch element to be selected among the plurality of switch elements 10. The row address signal is a signal indicating an address of the row in the address indicated in the address signal, and the column address signal is a signal indicating an address of the column.

In information writing and erasing cycles, the control circuit 524 outputs, to the write/erase circuit 516, a writing signal and an erasing signal that give an instruction for application of a writing or erasing voltage depending on data input to the data input/output circuit 520. Furthermore, in an information reading cycle, the control circuit 524 outputs a reading signal that gives an instruction for a reading operation to the column selection circuit 514.

The row selection circuit 512 receives the row address signal output from the address input circuit 522, selects one of the word lines WL0, WL1, WL2 • • • depending on the row address signal, and applies a predetermined voltage to the selected word line.

The column selection circuit 514 receives the column address signal output from the address input circuit 522, selects one of the bit lines BL0, BL1, BL2 • • • depending on the column address signal, and applies a predetermined voltage to the selected bit line.

When the write/erase circuit 516 receives the writing signal output from the control circuit 524, the write/erase circuit 516 outputs a signal that instructs the row selection circuit 512 to apply the writing voltage to the selected word line, and outputs a signal that instructs the column selection circuit 514 to apply the writing voltage to the selected bit line. Furthermore, when the write/erase circuit 516 receives the erasing signal output from the control circuit 524, the write/erase circuit 516 outputs a signal that instructs the row selection circuit 512 to apply the erasing voltage to the selected word line, and outputs a signal that instructs the column selection circuit 514 to apply the erasing voltage to the selected bit line.

In the information reading cycle, the sense amplifier 518 detects an amount of current flowing through the selected bit line to be read and determines whether the data is "1" or "0". The data obtained as a result is output to an external circuit via the data input/output circuit 520.

Figure 2:
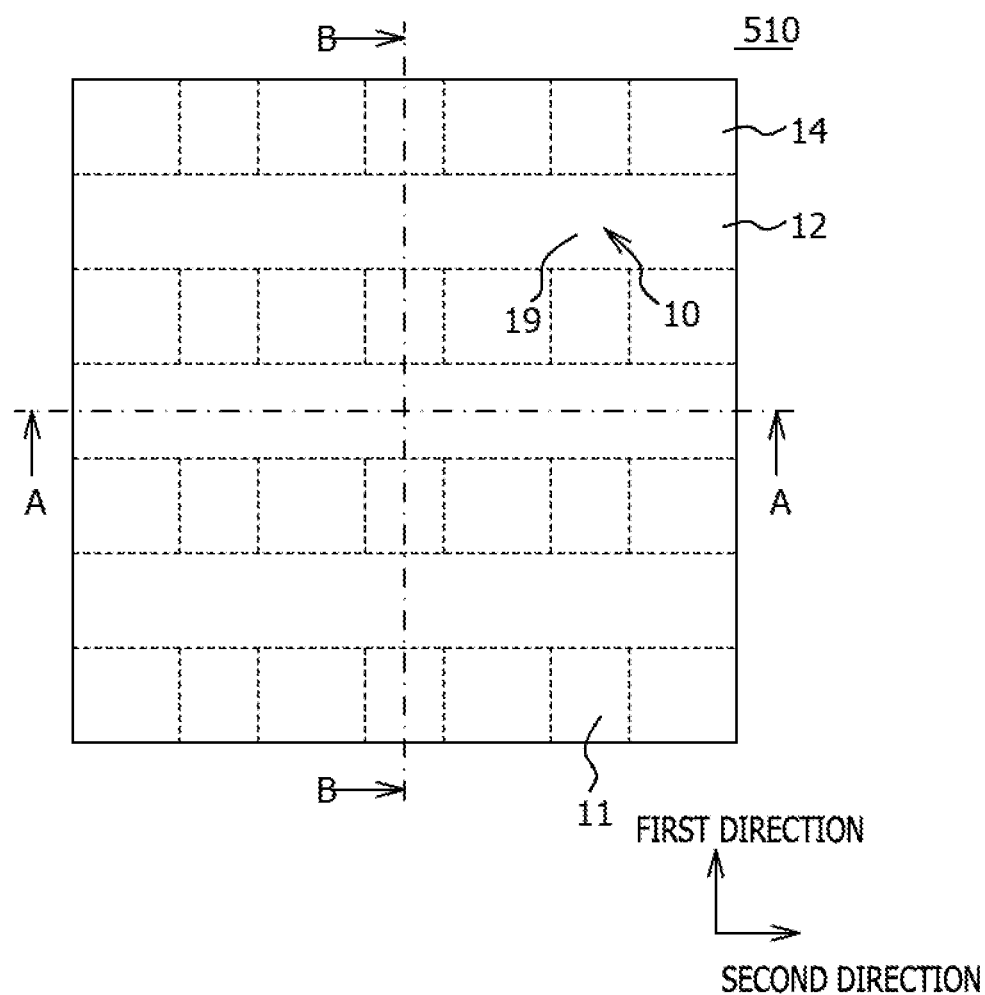
FIG. 2 is a plan view illustrating an example of a memory cell array.

FIG. 2 is a plan view illustrating an example of a memory cell array. As illustrated in FIG. 2, the memory cell array 510 includes a plurality of lower wiring lines 11 corresponding to bit lines, and a plurality of upper wiring lines 12 corresponding to word lines. The lower wiring line 11 extends in a first direction, and the upper wiring line 12 extends in a second direction intersecting (for example, orthogonal to) the first direction. The upper wiring line 12 is embedded in the insulating film 14. Similarly, the lower wiring line 11 is also embedded in an insulating film. The switch element 10 is formed in an intersection region 19 where the lower wiring line 11 and the upper wiring line 12 intersect in different levels. Note that, in the embodiment, the lower wiring line 11 corresponds to the first wiring line in the claims, and the upper wiring line 12 corresponds to the second wiring line in the claims.

Figure 3A:
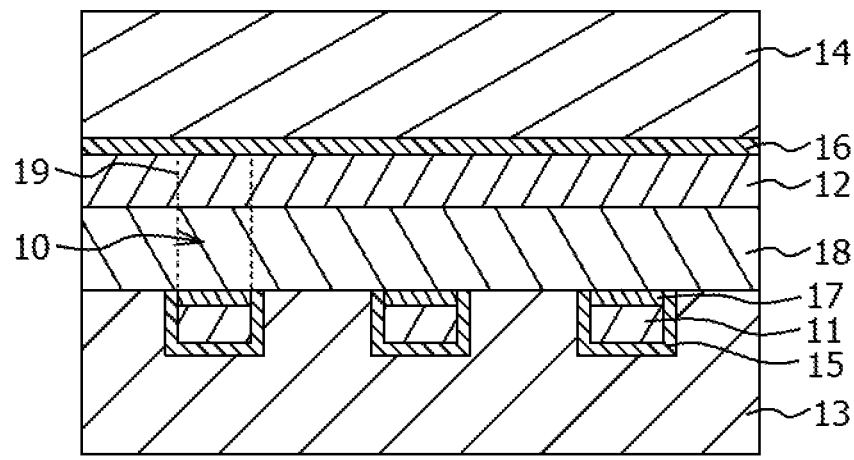
FIGS. 3A and 3B are cross-sectional views illustrating a switch element according to a first embodiment.
Figure 3B:
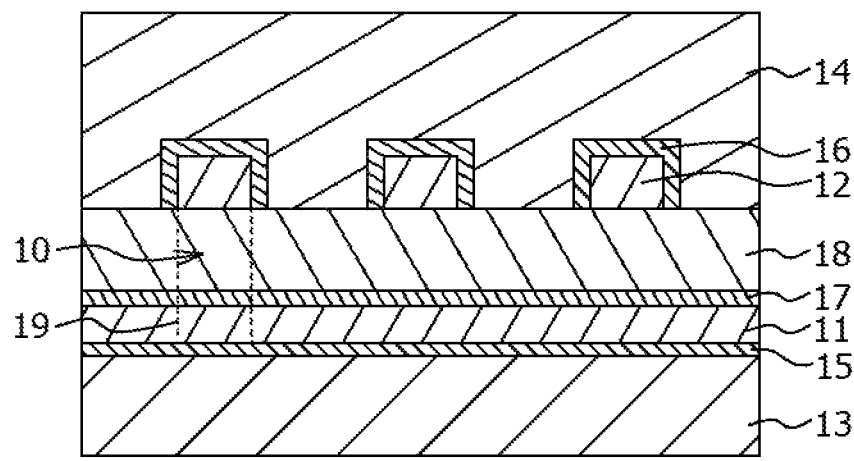

FIGS. 3A and 3B are cross-sectional views illustrating a switch element according to a first embodiment. FIG. 3A is a cross section of a portion corresponding to A-A in FIG. 2, and FIG. 38 is a cross section of a portion corresponding to B-B in FIG. 2. As illustrated in FIGS. 3A and 3B, the upper wiring line 12 is embedded in the insulating film 14 while one surface is exposed from a surface of the insulating film 14. The upper wiring line 12 includes copper, for example. The insulating film 14 is, for example, a silicon oxide film to which carbon is added, but may be another inorganic insulating film such as a silicon dioxide film or a silicon nitride film, or may be an organic insulating film such as a resin film. The width of the upper wiring line 12 is, for example, about 0.1 µm to 0.5 µm, and is 0.2 µm as an example. The thickness of the upper wiring line 12 is, for example, about 0.15 µm to 0.75 µm, and is 0.30 µm as an example. The interval between the adjacent upper wiring lines 12 is, for example, about 1.0 µm to 2.0 µm, and is 1.0 µm as an example.

Between the upper wiring line 12 and the insulating film 14, a barrier metal layer 16 is provided to suppress that copper atoms contained in the upper wiring line 12 diffuse into the insulating film 14. The barrier metal layer 16 is, for example, a tantalum layer, but may include at least one of titanium nitride, tantalum, tantalum nitride, tungsten nitride, cobalt, or ruthenium. The thickness of the barrier metal layer 16 is preferably a thickness in which diffusion of copper atoms into the insulating film 14 may be suppressed, is, for example, about 10 nm to 100 nm, and is 20 nm as an example.

The lower wiring line 11 is embedded in an insulating film 13. The lower wiring line 11 includes, for example, copper. The insulating film 13 is, for example, a silicon oxide film to which carbon is added, but may be another inorganic insulating film such as a silicon dioxide film or a silicon nitride film, or may be an organic insulating film such as a resin film. The insulating film 13 may include the same material as the insulating film 14, or may include a different material. The width of the lower wiring line 11 is, for example, about 0.1 µm to 0.5 µm, and is 0.2 µm as an example. The thickness of the lower wiring line 11 is, for example, about 0.15 µm to 0.75 µm, and is 0.30 µm as an example. The interval between the adjacent lower wiring lines 11 is, for example, about 1.0 µm to 2.0 µm, and is 1.0 µm as an example. The width and thickness of the lower wiring line 11, and the interval between the adjacent lower wiring lines 11 may be the same as or different from the width and thickness of the upper wiring line 12, and the interval between the adjacent upper wiring lines 12.

Between the lower wiring line 11 and the insulating film 13, a barrier metal layer 15 is provided to suppress that copper atoms contained in the lower wiring line 11 diffuse into the insulating film 13. The barrier metal layer 15 is, for example, a tantalum layer, but may include at least one of titanium nitride, tantalum, tantalum nitride, tungsten nitride, cobalt, or ruthenium. The barrier metal layer 15 may include the same material as the barrier metal layer 16 or may include a different material. The thickness of the barrier metal layer 15 is preferably a thickness in which diffusion of copper atoms into the insulating film 13 may be suppressed, is, for example, about 10 nm to 100 nm, and is 20 nm as an example.

Between the lower wiring line 11 and the upper wiring line 12, an ion conductive layer 18 is provided. The ion conductive layer 18 is provided over an entire region where the plurality of lower wiring lines 11 and the plurality of upper wiring lines 12 are provided. The ion conductive layer 18 is a layer enabled to conduct metal ions. The ion conductive layer 18 includes, for example, zirconium nitride. The thickness of the ion conductive layer 18 is, for example, about 10 nm to 100 nm, and is 50 nm as an example.

Between the lower wiring line 11 and the ion conductive layer 18, a metal oxide film 17 is provided. The metal oxide film 17 is, for example, copper oxide including a surface oxidized of the lower wiring line 11. The copper oxide may have a composition of CuO, a composition of $Cu_2O$, or a mixture of both. The thickness of the metal oxide film 17 is, for example, about 1 nm to 10 nm, and is 5 nm as an example. The metal oxide film 17 is in contact with, for example, the ion conductive layer 18 and the lower wiring line 11.

The switch element 10 formed in the intersection region 19 where the lower wiring line 11 and the upper wiring line 12 intersect includes: the lower wiring line 11; the upper wiring line 12; the ion conductive layer 18 sandwiched between the lower wiring line 11 and the upper wiring line 12; and the metal oxide film 17 sandwiched between the lower wiring line 11 and the ion conductive layer 18.

FIGS. 4A to 6D are cross-sectional views illustrating a method for manufacturing the switch element according to the first embodiment. FIGS. 4A to 4D, 5A to 5D, 6A, and 6B each are a cross section of a portion corresponding to A-A in FIG. 2. FIGS. 4E to 4H, 5E to 5H, 6C, and 6D each are a cross section of a portion corresponding to B-B in FIG. 2.

Figure 4A:
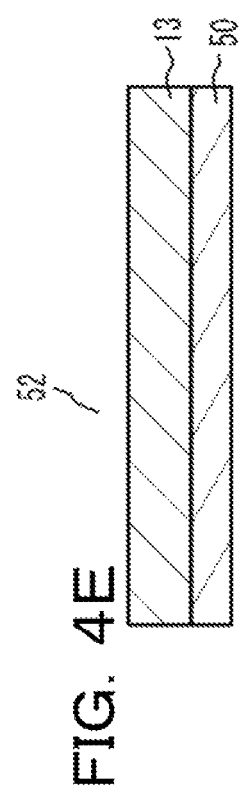
FIGS. 4A to 4H are cross-sectional views (part 1) illustrating a method for manufacturing the switch element according to the first embodiment.
Figure 4B:
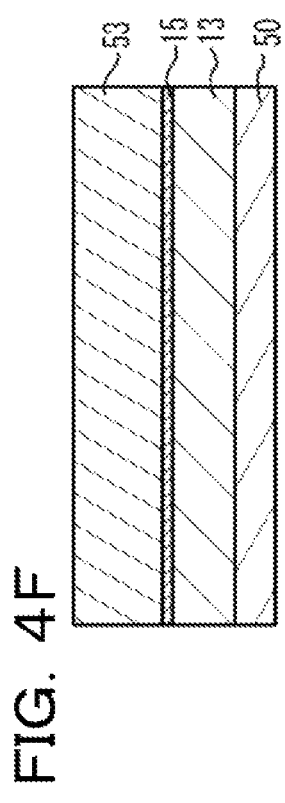
Figure 4C:
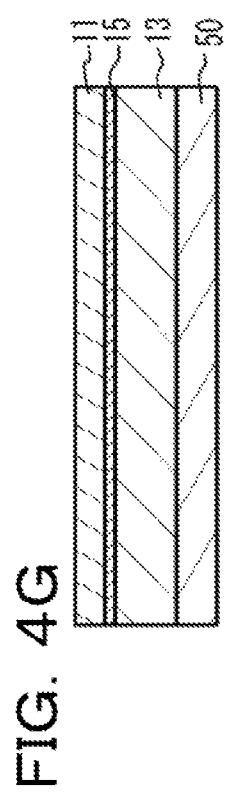
Figure 4D:
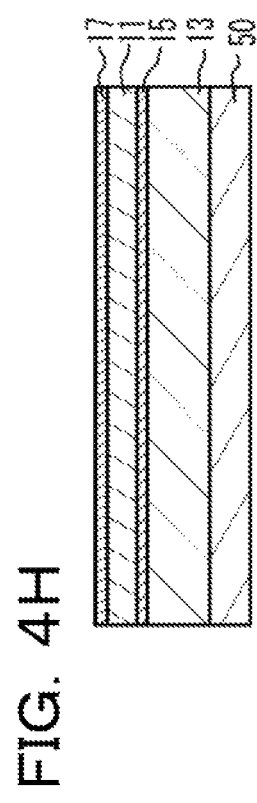
Figure 4E:
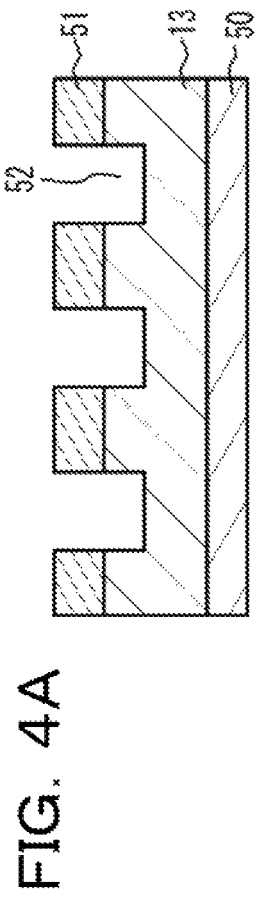

As illustrated in FIGS. 4A and 4E, on the insulating film 13 formed on a first substrate 50 by a chemical vapor deposition (CVD) method, a resist pattern 51 is formed that includes an opening in a region where the lower wiring line 11 is to be formed. Dry etching is performed on the insulating film 13 with the resist pattern 51 as a mask, to form a plurality of recesses 52 in the insulating film 13. The recess 52 is formed to extend in a direction in which the lower wiring line 11 extends. The depth of the recess 52 is, for example, about 0.3 µm. The width of the recess 52 is, for example, about 0.2 µm. The interval between the adjacent recesses 52 is, for example, about 1.0 µm.

Figure 4F:
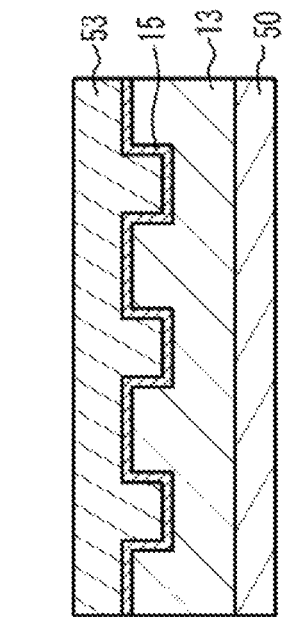

As illustrated in FIGS. 4B and 4F, after the resist pattern 51 is removed, the barrier metal layer 15 is formed on the insulating film 13 by a sputtering method. The barrier metal layer 15 is formed along the unevenness due to the recess 52 of the insulating film 13. The barrier metal layer 15 is, for example, a tantalum layer, and its thickness is, for example, about 20 nm. Thereafter, a copper film 53 is formed on the barrier metal layer 15 by an electrolytic plating method. The thickness of the copper film 53 is, for example, about 500 nm. The copper film 53 is formed by filling the recess 52 of the insulating film 13.

Figure 4G:
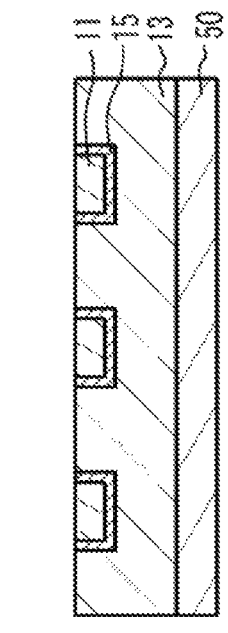

As illustrated in FIGS. 4C and 4G, the copper film 53 and the barrier metal layer 15 are removed until a surface of the insulating film 13 is exposed, by using a chemical mechanical polishing (CMP) method. As a result, the lower wiring line 11 including the copper film 53 embedded in the insulating film 13, and the barrier metal layer 15 interposed between the lower wiring line 11 and the insulating film 13 are formed.

Figure 4H:
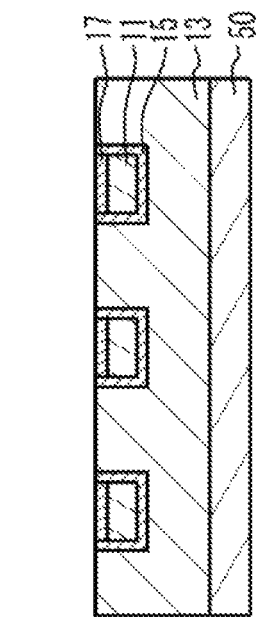

As illustrated in FIGS. 4D and 4H, the surface of the lower wiring line 11 exposed from the insulating film 13 is oxidized by plasma oxidation that performs irradiation with oxygen plasma to form the metal oxide film 17 including copper oxide. The thickness of the metal oxide film 17 is, for example, about 5 nm. Note that, instead of plasma oxidation, thermal oxidation that performs heating in an oxygen atmosphere, solution oxidation that performs immersion in a solution containing an oxidant (for example, a solution of hydrogen peroxide, potassium persulfate, potassium permanganate, or the like), or UV ozone oxidation that performs irradiation with UV light in the atmosphere may be performed. As a result, the formation is completed of the first substrate 50 on the lower wiring line 11 side.

Here, an example of forming the metal oxide film 17 will be described. For example, the first substrate 50 is placed in a vacuum furnace, the pressure in the vacuum furnace is set to 60 Pa, and the surface of the lower wiring line 11 is irradiated with oxygen plasma for 10 minutes by a downflow method. By this method, the metal oxide film 17 having a ratio between CuO and $Cu_2O(CuO/Cu_2O)$ of about 3.0 was formed on the surface of the lower wiring line 11. For example, the first substrate 50 is placed in a quartz tube, a mixed gas containing 10% oxygen and 90% argon is introduced into the quartz tube, and thermal oxidation is performed at 400° C. for 5 minutes. By this method, the metal oxide film 17 of $Cu_2O$ was formed on the surface of the lower wiring line 11. For example, the surface of the lower wiring line 11 was irradiated with UV light having a wavelength of 184.9 nm for 5 minutes. By this method, the metal oxide film 17 in which CuO was predominant was formed on the surface of the lower wiring line 11. For example, the lower wiring line 11 is immersed in a solution containing hydrogen peroxide whose pH is adjusted to 9 for 3 minutes. By this method, the metal oxide film 17 containing the composition of CuO was formed on the surface of the lower wiring line 11.

Figure 5A:
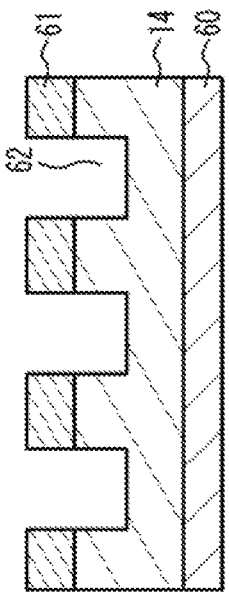
FIGS. 5A to 5H are cross-sectional views (part 2) illustrating the method for manufacturing the switch element according to the first embodiment.
Figure 5B:
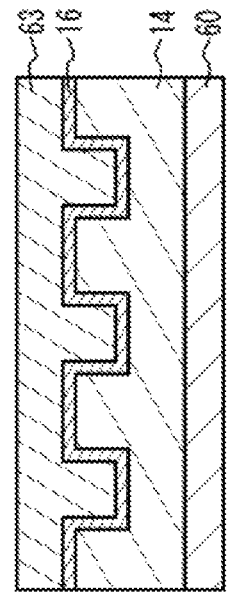
Figure 5C:
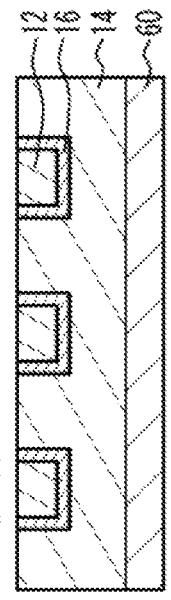
Figure 5D:
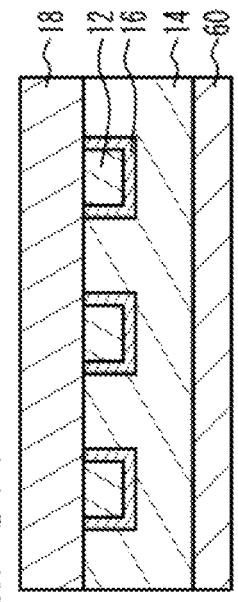
Figure 5E:
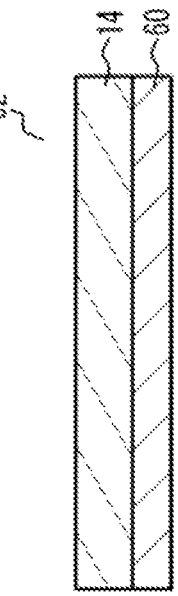

As illustrated in FIGS. 5A and 5E, on the insulating film 14 formed by the CVD method on a second substrate 60 different from the first substrate 50, a resist pattern 61 is formed that includes an opening in a region where the upper wiring line 12 is to be formed. Dry etching is performed on the insulating film 14 with the resist pattern 61 as a mask, to form a plurality of recesses 62 in the insulating film 14. The recess 62 is formed to extend in a direction in which the upper wiring line 12 extends. The depth of the recess 62 is, for example, about 0.3 μm. The width of the recess 62 is, for example, about 0.2 μm. The interval between the adjacent recesses 62 is, for example, 1.0 μm.

Figure 5F:
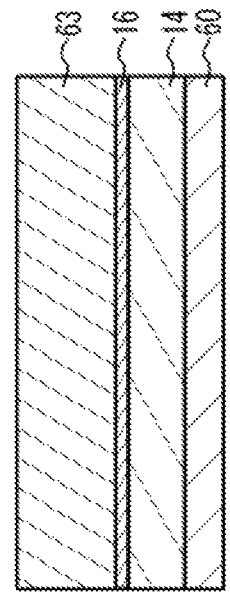

As illustrated in FIGS. 5B and 5F, after the resist pattern 61 is removed, the barrier metal layer 16 is formed on the insulating film 14 by the sputtering method. The barrier metal layer 16 is formed along the unevenness due to the recess 62 of the insulating film 14. The barrier metal layer 16 is, for example, a tantalum layer, and its thickness is, for example, about 20 nm. Thereafter, a copper film 63 is formed on the barrier metal layer 16 by the electrolytic plating method. The thickness of the copper film 63 is, for example, about 500 nm. The copper film 63 is formed by filling the recess 62 of the insulating film 14.

Figure 5G:
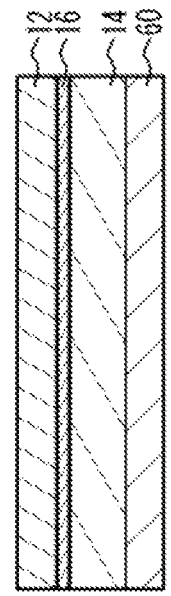

As illustrated in FIGS. 5C and 5G, the copper film 63 and the barrier metal layer 16 are removed until a surface of the insulating film 14 is exposed, by using the CMP method. As a result, the upper wiring line 12 including the copper film 63 embedded in the insulating film 14, and the barrier metal layer 16 interposed between the upper wiring line 12 and the insulating film 14 are formed.

Figure 5H:
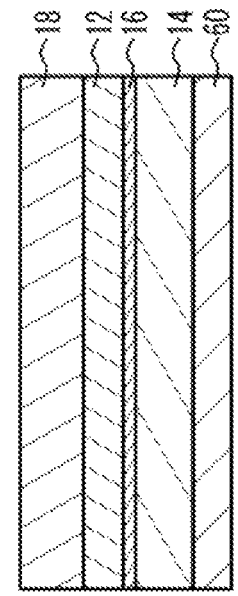

As illustrated in FIGS. 5D and 5H, the ion conductive layer 18 is formed on the insulating film 14 by the sputtering method. As an example, sputtering using a zirconium target is performed in a mixed gas atmosphere of argon and nitrogen at room temperature, whereby the ion conductive layer 18 including zirconium nitride is formed. The ion conductive layer 18 is formed on the entire surface of the insulating film 14 and is in direct contact with the upper wiring line 12. The thickness of the ion conductive layer 18 is, for example, 50 nm. Note that, the ion conductive layer 18 may be formed by the CVD method. As a result, the formation is completed of the second substrate 60 on the upper wiring line 12 side.

Figure 6A:
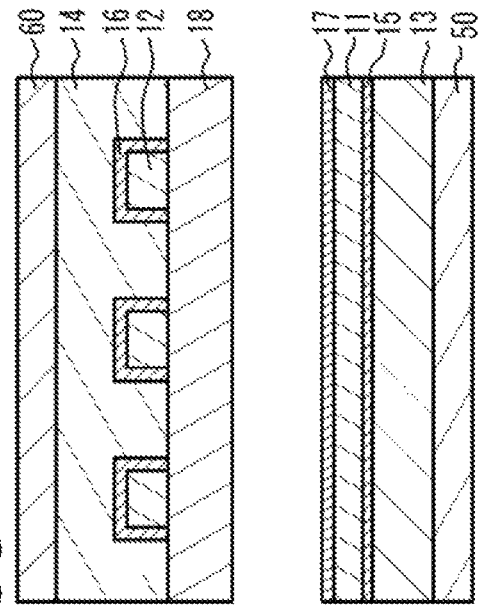
FIGS. 6A to 6D are cross-sectional views (part 3) illustrating the method for manufacturing the switch element according to the first embodiment.
Figure 6B:
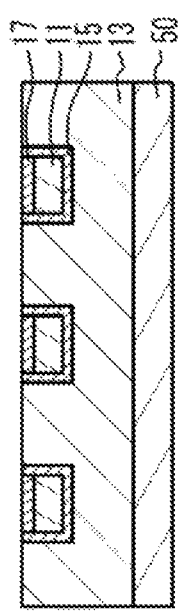
Figure 6C:
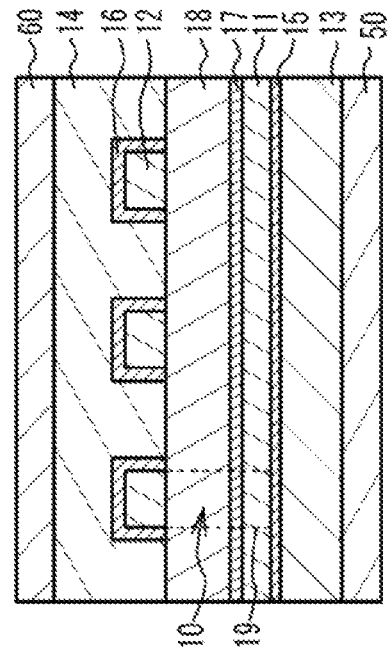

As illustrated in FIGS. 6A and 6C, the first substrate 50 and the second substrate 60 are placed in a vacuum furnace, to cause the insulating film 13 and the metal oxide film 17 of the first substrate 50 to face the ion conductive layer 18 of the second substrate 60. At this time, a cleaning process may be performed in which surfaces of the insulating film 13 and the metal oxide film 17, and a surface of the ion conductive layer 18 are irradiated with argon plasma, to remove impurities attached to the surfaces. The cleaning process may be performed at a degree of vacuum of less than or equal to 1×10−6 Pa.

Figure 6D:
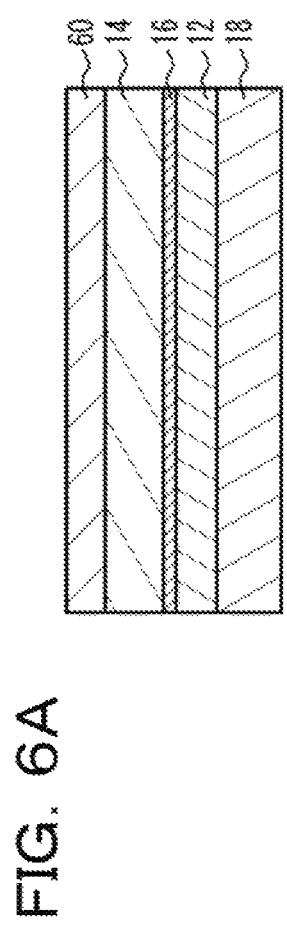

As illustrated in FIGS. 6B and 6D, in a state where the substrate temperature is about 200° C. and the degree of vacuum is less than or equal to 1×10−6 Pa, the first substrate 50 and the second substrate 60 are pressed together with a pressure of about 5N. As a result, the insulating film 13 and the metal oxide film 17 are directly bonded to the ion conductive layer 18, and the switch element 10 is formed in the intersection region 19 where the lower wiring line 11 and the upper wiring line 12 intersect. For example, the insulating film 13 and the metal oxide film 17 are bonded to the ion conductive layer 18 by a direct bond interconnect (DBI) using OH group molecular bonding.

Figure 7A:
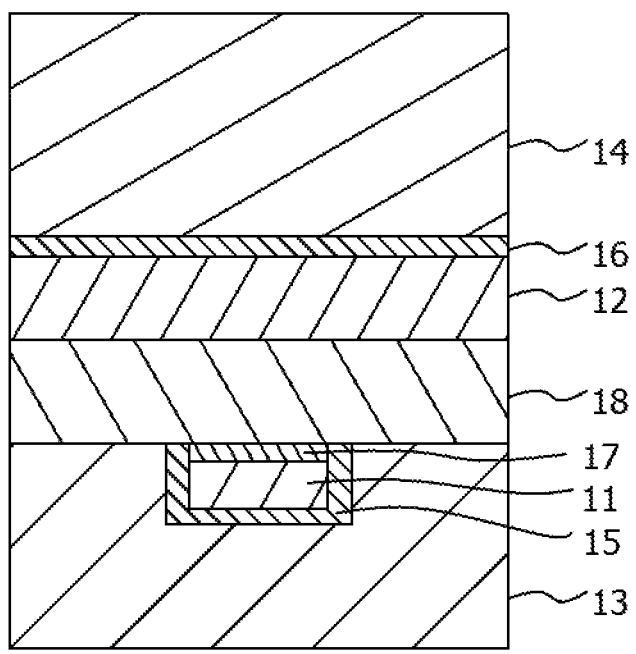
FIGS. 7A and 7B are cross-sectional views explaining that the switch element according to the first embodiment functions as a resistance change element.
Figure 7B:
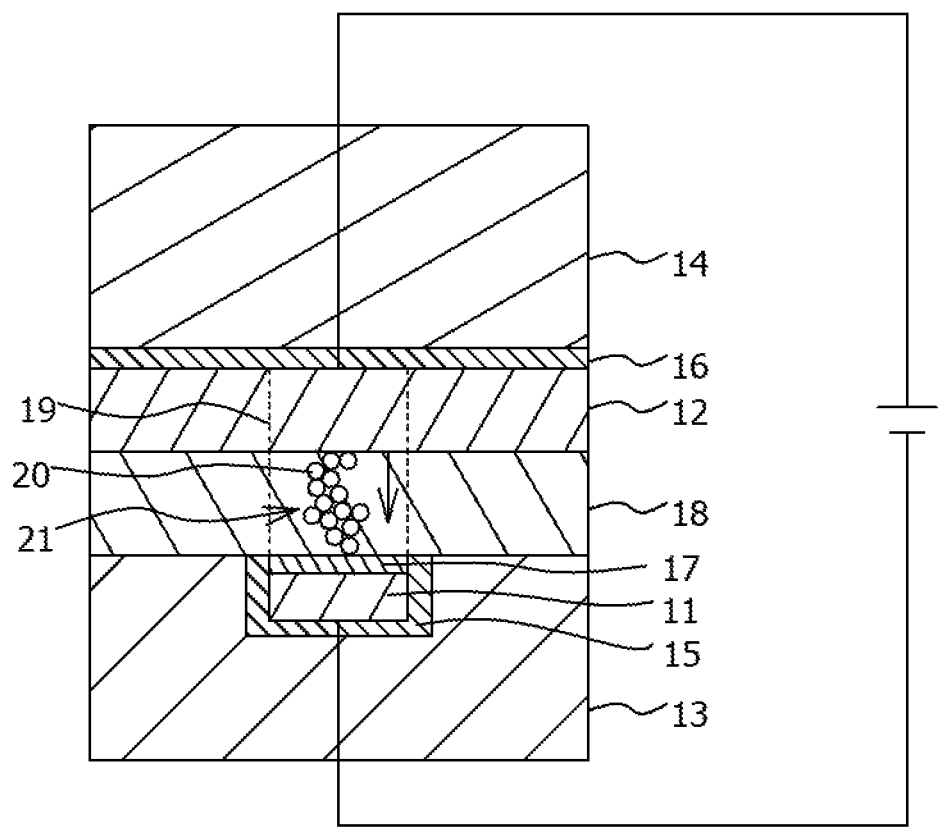

As described with reference to FIG. 1, the switch element 10 includes the resistance change element 30 and the diode element 40. FIGS. 7A and 7B are cross-sectional views explaining that the switch element according to the first embodiment functions as a resistance change element. As illustrated in FIG. 7A, before a voltage is applied between the lower wiring line 11 and the upper wiring line 12, the lower wiring line 11 and the upper wiring line 12 are set in a high resistance state due to that the ion conductive layer 18 that is an insulating layer is interposed therebetween.

As illustrated in FIG. 7, a voltage positive with respect to the lower wiring line 11 is applied to the upper wiring line 12 so that an electric field from the upper wiring line 12 toward the lower wiring line 11 is generated in the intersection region 19 where the lower wiring line 11 and the upper wiring line 12 intersect. As a result, copper ions 20 are supplied from the upper wiring line 12 to the ion conductive layer 18, and a copper bridge 21 that has a filament shape and in which the copper ions 20 are deposited as a metal is formed in the ion conductive layer 18. The copper bridge 21 is formed, whereby the resistance between the lower wiring line 11 and the upper wiring line 12 is set in a low resistance state. As described above, the switch element 10 functions as a memory that records data "1" or "0" by the fact that the resistance between the lower wiring line 11 and the upper wiring line 12 is set in the high resistance state or the low resistance state. For example, the switch element may be used as a product-sum operation memory in a neurochip simulating a neuron network. Note that, in the embodiment, a case will be described where the switch element functions as a memory due to that the lower wiring line 11 and the upper wiring line 12 are set in the high resistance state or the low resistance state, as an example, but the switch element may simply function as a switch.

Figure 8:
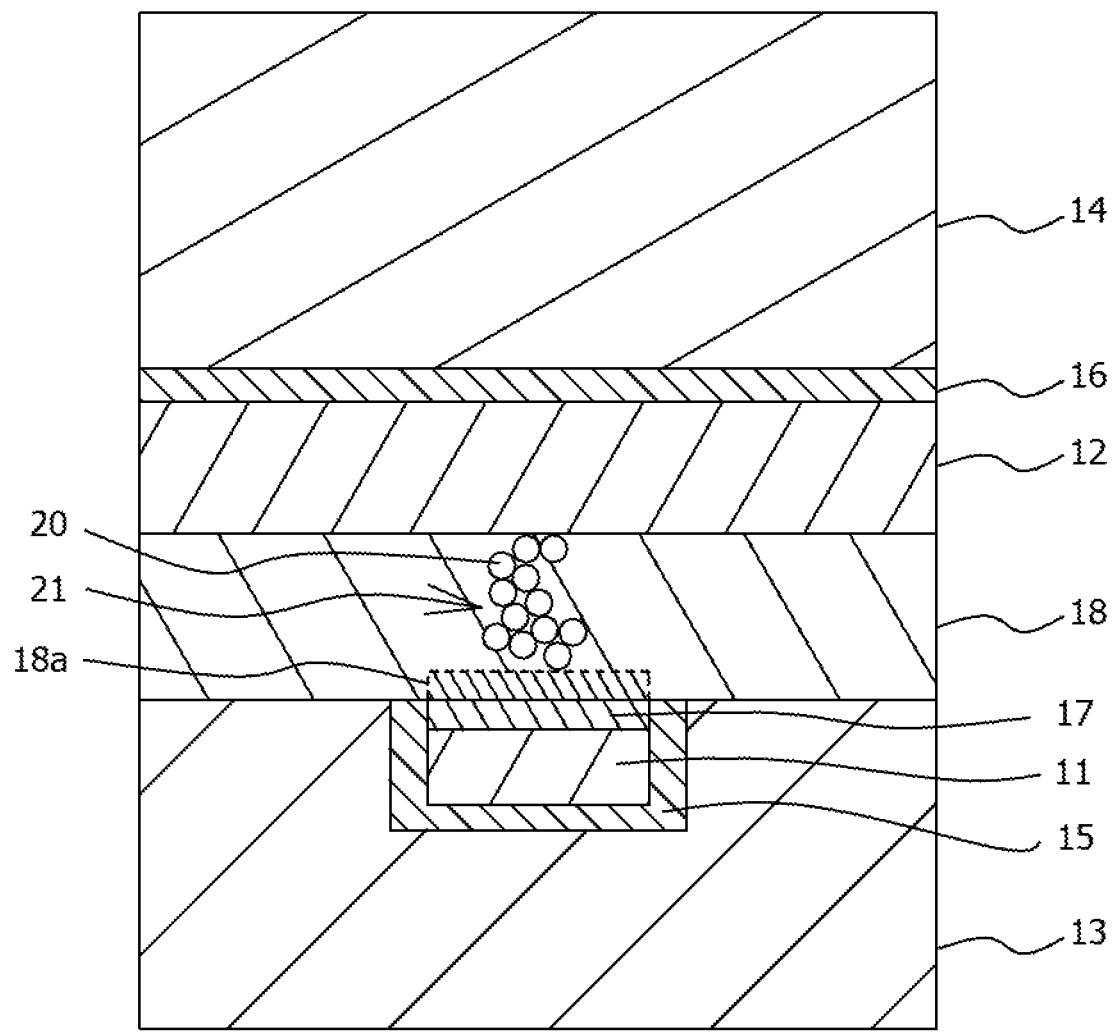
FIG. 8 is a cross-sectional view explaining that the switch element according to the first embodiment functions as a diode element.

FIG. 8 is a cross-sectional view explaining that the switch element according to the first embodiment functions as a diode element. As illustrated in FIG. 8, in the ion conductive layer 18 formed between the metal oxide film 17 and the upper wiring line 12, zirconium oxide (ZrO$_2$) is formed in a region 18a near an interface with the metal oxide film 17. It is considered that due to the electric field applied between the lower wiring line 11 and the upper wiring line 12 and/or a thermodynamic reaction at the interface between the ion conductive layer 18 and the metal oxide film 17, oxygen is exchanged between the metal oxide film 17 and the ion conductive layer 18, whereby the zirconium oxide is formed. Furthermore, it is considered that zirconium oxide is easily formed because zirconium is more easily oxidized than copper.

It is known that copper oxide is a p-type semiconductor and zirconium oxide is an n-type semiconductor, and the interface between the metal oxide film 17 and the ion conductive layer 18 forms a pn junction. For this reason, a rectifying action is obtained in which a current flows when a voltage negative with respect to the lower wiring line 11 is applied to the upper wiring line 12, and conversely, a flow of the current is suppressed when a voltage positive with respect to the lower wiring line 11 is applied to the upper wiring line 12.

Figure 9:
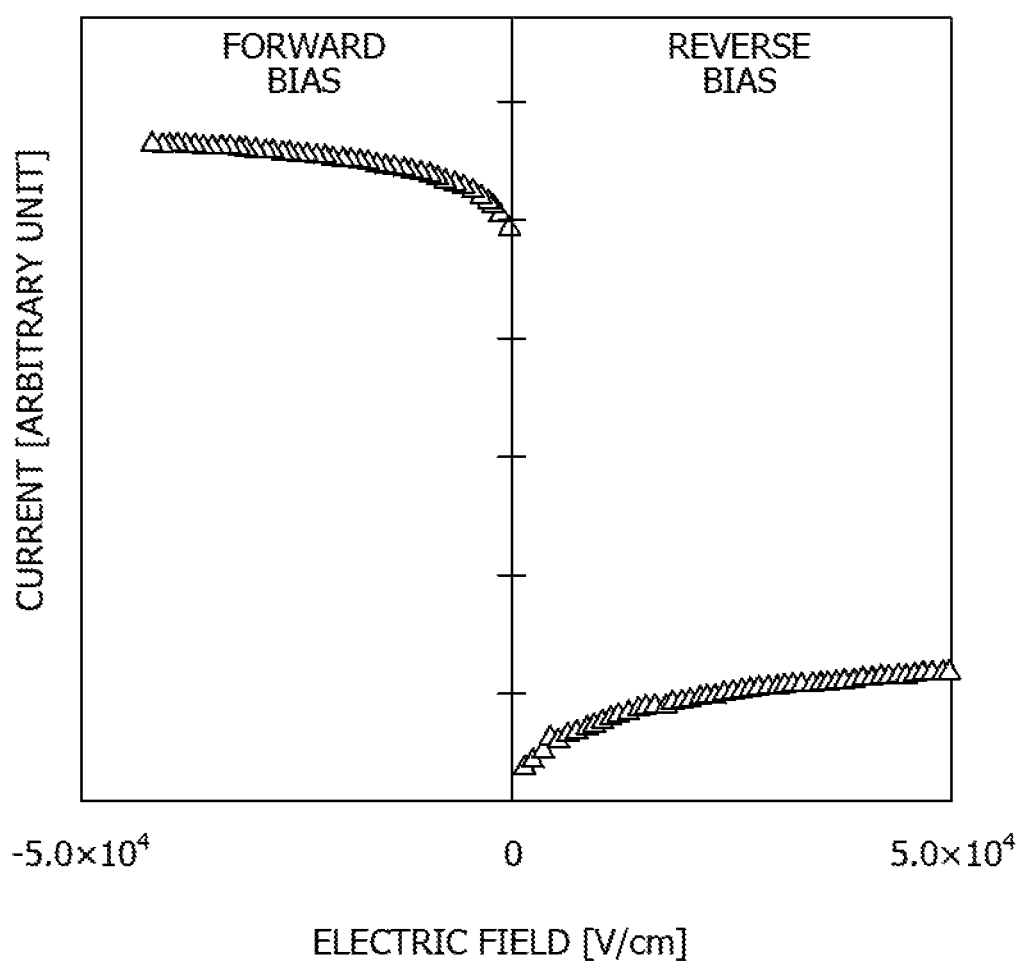
FIG. 9 is a diagram illustrating a rectification characteristic of the switch element according to the first embodiment.

FIG. 9 is a diagram illustrating a rectification characteristic of the switch element according to the first embodiment. FIG. 9 is a measurement result of the rectification characteristic when each part of the switch element 10 includes the following materials and the copper bridge 21 is formed by applying a voltage positive with respect to the upper wiring line 12 to the lower wiring line 11. The lower wiring line 11 is a copper wiring line having a width of 0.2 μm and a thickness of 0.25 μm. The insulating film 13 is a silicon oxide film to which carbon is added. The barrier metal layer 15 is a tantalum layer having a thickness of 20 nm. The metal oxide film 17 includes copper oxide having a thickness of 5 nm. The ion conductive layer 18 is a zirconium nitride layer having a thickness of 50 nm. The upper wiring line 12 is a copper wiring line having a width of 0.2 μm and a thickness of 0.25 μm. The insulating film 14 is a silicon oxide film to which carbon is added. The barrier metal layer 16 is a tantalum layer having a thickness of 20 nm. The copper bridge 21 was formed by generating an electric field of 5 V/cm between the lower wiring line 11 and the upper wiring line 12.

As illustrated in FIG. 9, it was confirmed that a current value when a reverse bias was applied to the switch element 10 was sufficiently smaller than a current value when a forward bias was applied, and a good rectification characteristic was obtained.

Figure 10A:
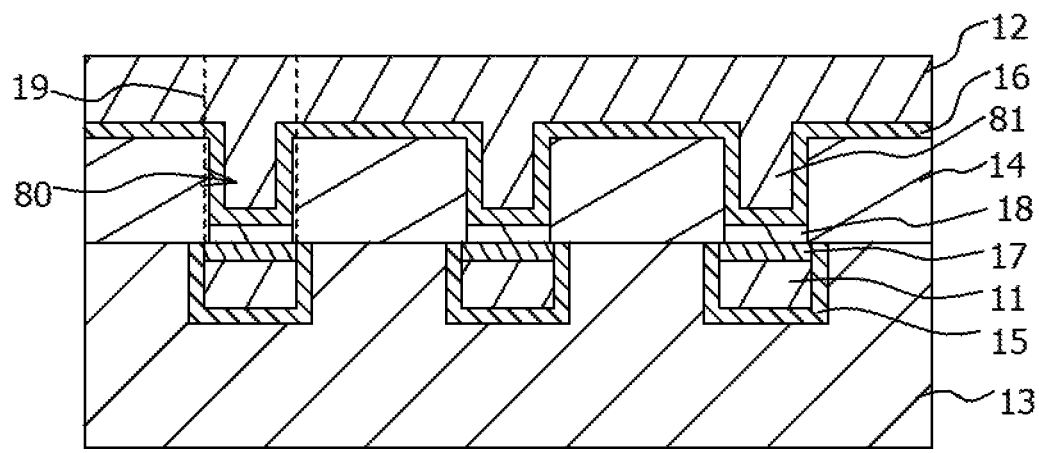
FIGS. 10A and 10B are cross-sectional views illustrating a switch element according to a first comparative example.
Figure 10B:
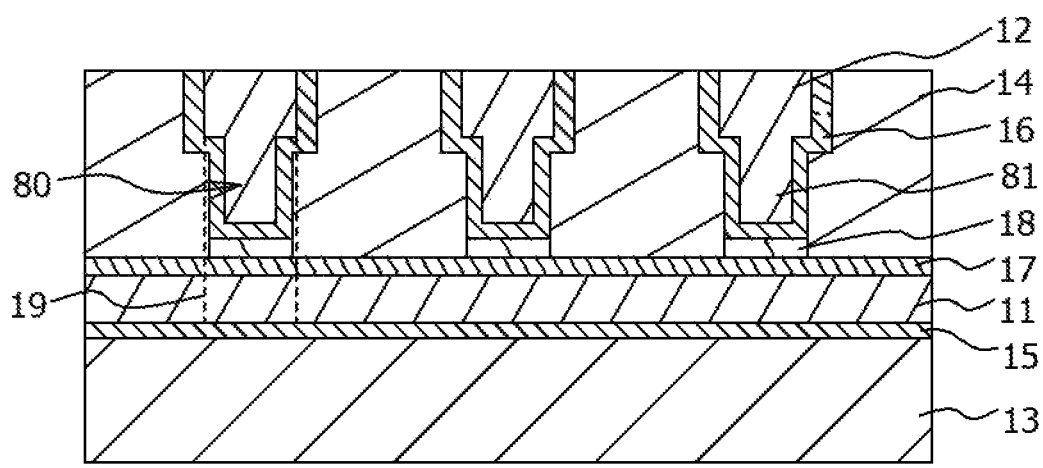

FIGS. 10A and 10B are cross-sectional views illustrating a switch element according to a first comparative example. FIG. 10A is a cross section of a portion corresponding to A-A in FIG. 2, and FIG. 10B is a cross section of a portion corresponding to B-B in FIG. 2. As illustrated in FIGS. 10A and 10, in the first comparative example, a plurality of the ion conductive layers 18 is provided respectively corresponding to a plurality of the metal oxide films 17 formed on the plurality of lower wiring lines 11. The upper wiring line 12 and a plurality of vias 81 in direct contact with the upper wiring line 12 are formed in the insulating film 14. The plurality of vias 81 includes copper similarly to the upper wiring line 12, and is formed corresponding to the respective plurality of ion conductive layers 18. For example, the via 81 is provided between the upper wiring line 12 and each of the plurality of ion conductive layers 18. The barrier metal layer 16 is provided to extend from a portion between the upper wiring line 12 and the insulating film 14 to a portion between the via 81 and the insulating film 14. Furthermore, the barrier metal layer 16 is also provided between the via 81 and the ion conductive layer 18. A switch element 80 of the first comparative example includes the upper wiring line 12, the via 81, the lower wiring line 11, the ion conductive layer 18 sandwiched between the via 81 and the lower wiring line 11, and the metal oxide film 17 sandwiched between the lower wiring line 11 and the ion conductive layer 18. Other structures are the same as those of the first embodiment, so the description is not provided here.

FIGS. 11A to 12D are cross-sectional views illustrating a method for manufacturing the switch element according to the first comparative example. FIGS. 11A to 11C, 12A, 12B each are cross section of a portion corresponding to A-A in FIG. 2. FIGS. 11D to 11F, 12C, and 12D each are a cross section of a portion corresponding to B-B in FIG. 2.

Figure 11D:
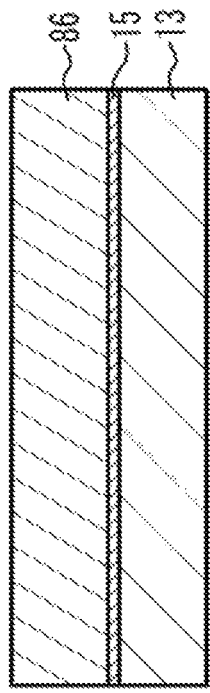
FIGS. 11A to 11F are cross-sectional views (part 1) illustrating a method for manufacturing the switch element according to the first comparative example.
Figure 11E:
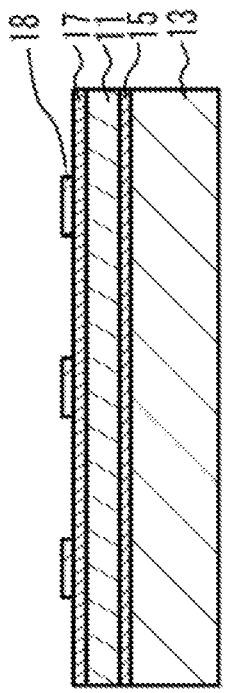
Figure 11F:
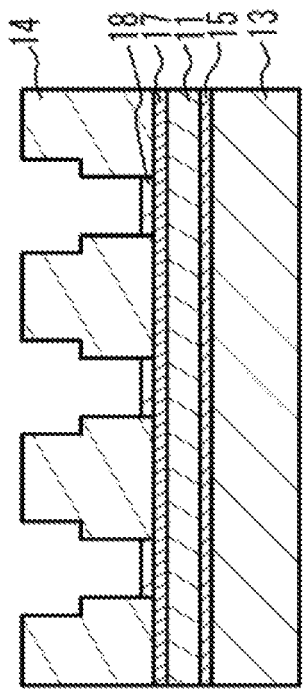
Figure 11A:
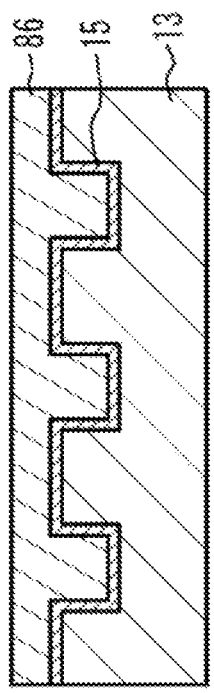

As illustrated in FIGS. 11A and 11D, on the insulating film 13 formed by the CVD method on a substrate (not illustrated), a resist pattern (not illustrated) is formed that includes an opening in a region where the lower wiring line 11 is to be formed. Dry etching is performed on the insulating film 13 with the resist pattern as a mask, to form a plurality of recesses. After the resist pattern is removed, the barrier metal layer 15 that is, for example, a tantalum layer is formed on the insulating film 13 by the sputtering method. Thereafter, a copper film 86 is formed on the barrier metal layer 15 by the electrolytic plating method.

Figure 11B:
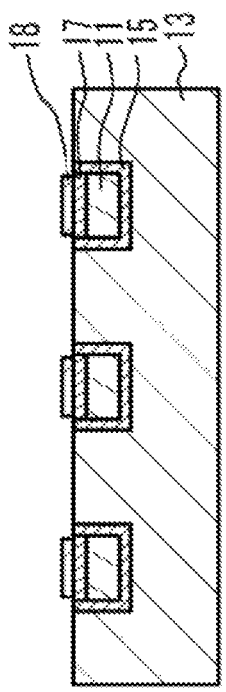

As illustrated in FIGS. 11B and 11E, the copper film 86 and the barrier metal layer 15 are removed until a surface of the insulating film 13 is exposed, by using the CMP method. As a result, the lower wiring line 11 including the copper film 86 embedded in the insulating film 13, and the barrier metal layer 15 interposed between the lower wiring line 11 and the insulating film 13 are formed. The surface of the lower wiring line 11 exposed from the insulating film 13 is oxidized by a plasma oxidation method to form the metal oxide film 17 including copper oxide. Thereafter, the ion conductive layer 18 is formed on the insulating film 13 by the sputtering method, and then dry etching is performed on the ion conductive layers 18 so that the ion conductive layers 18 remain that are separated from each other corresponding to the respective plurality of metal oxide films 17.

Figure 11C:
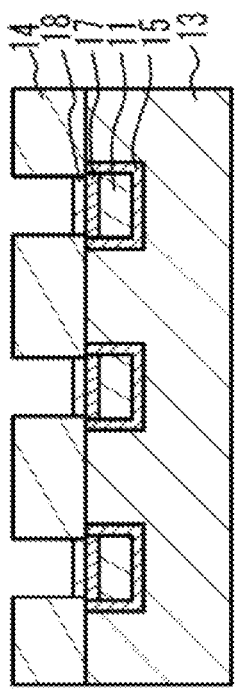

As illustrated in FIGS. 11C and 11F, the insulating film 14 that covers the plurality of ion conductive layers 18 is formed on the insulating film 13 by the CVD method. A recess for forming the via 81 is formed in the insulating film 14 by a dry etching method. Then, a recess for forming the upper wiring line 12 is formed in the insulating film 14 by the dry etching method.

As illustrated in FIGS. 12A and 12C, the barrier metal layer 16 that is, for example, a tantalum layer is formed on the insulating film 14 by the sputtering method. Thereafter, a copper film 87 is formed on the barrier metal layer 16 by the electrolytic plating method.

As illustrated in FIGS. 12B and 12D, the copper film 87 and the barrier metal layer 16 are removed until a surface of the insulating film 14 is exposed, by using the CMP method. As a result, the via 81 and the upper wiring line 12 including the copper film 87 are formed in the insulating film 14. The barrier metal layer 16 is formed between the upper wiring line 12 and the insulating film 14, and between the via 81 and the insulating film 14. The barrier metal layer 16 is also formed between the via 81 and the ion conductive layer 18.

According to the first comparative example, to suppress that copper atoms contained in the upper wiring line 12 and the via 81 diffuse into the insulating film 14, the barrier metal layer 16 is formed between the upper wiring line 12 and the insulating film 14 and between the via 81 and the insulating film 14. The barrier metal layer 16 is formed by using the sputtering method as illustrated in FIGS. 12A and 12C. For this reason, as illustrated in FIGS. 10A and 10B, the barrier metal layer 16 is also formed between the via 81 and the ion conductive layer 18.

When the barrier metal layer 16 is formed between the via 81 and the ion conductive layer 18, it becomes difficult for copper ions to be supplied from the via 81 to the ion conductive layer 18 even when a voltage is applied between the lower wiring line 11 and the upper wiring line 12 so that an electric field is generated from the upper wiring line 12 toward the lower wiring line 11. For this reason, it becomes difficult for a copper bridge to be formed in the ion conductive layer 18, and it becomes difficult to set the low resistance state between the lower wiring line 11 and the upper wiring line 12. On the other hand, when a voltage is applied between the lower wiring line 11 and the upper wiring line 12 so that an electric field is generated from the lower wiring line 11 toward the upper wiring line 12, copper ions are supplied from the lower wiring line 11 to the ion conductive layer 18, and a copper bridge is formed in the ion conductive layer 18. As described above, to form a copper bridge in the ion conductive layer 18, it is desirable to supply copper ions from the lower wiring line 11 to the ion conductive layer 18. However, when copper ions are supplied from the lower wiring line 11 to the ion conductive layer 18, the residual copper ion concentration in the metal oxide film 17 is high, a good pn junction is not obtained, and the rectification characteristic may degrade. Furthermore, when the via 81 is formed in the insulating film 14, a via hole forming step for forming the via 81 is performed, which increases manufacturing man-hours.

Figure 13A:
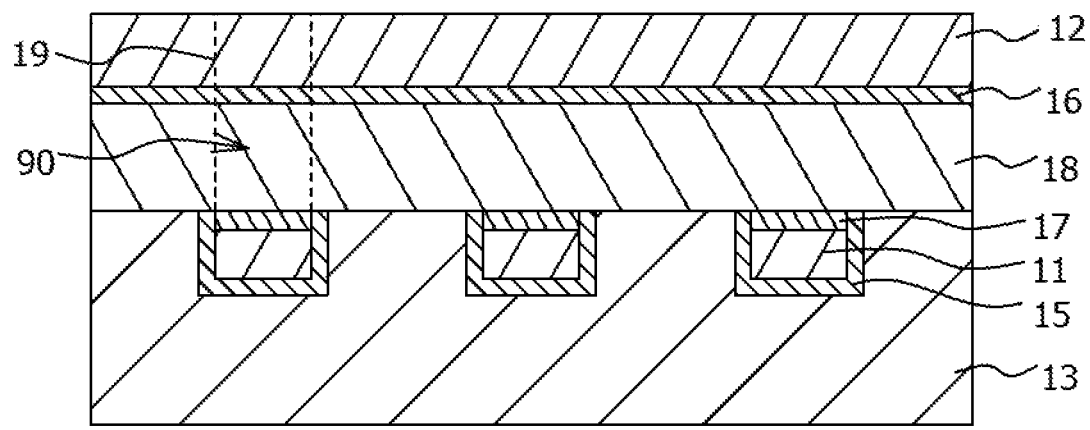
FIGS. 13A and 13B are cross-sectional views illustrating a switch element according to a second comparative example.
Figure 13B:
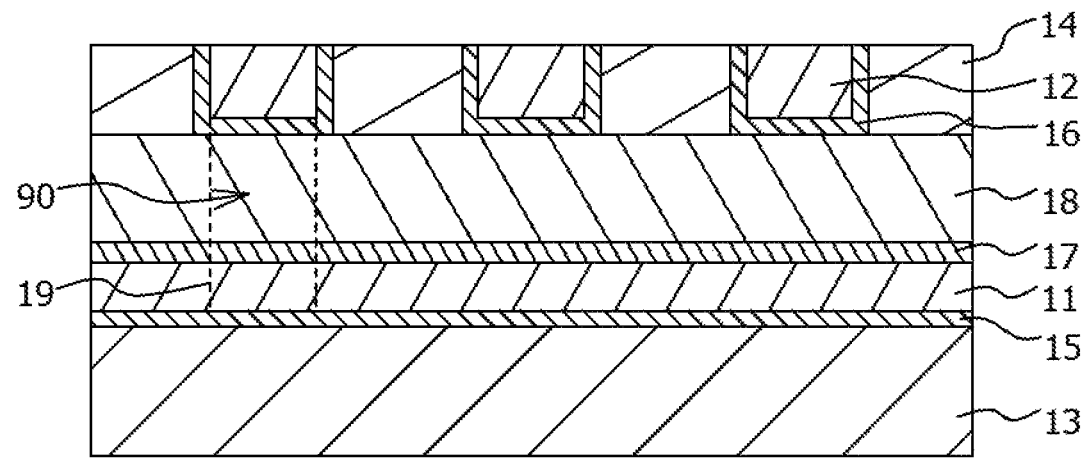

FIGS. 13A and 13B are cross-sectional views illustrating a switch element according to a second comparative example. FIG. 13A is a cross section of a portion corresponding to A-A in FIG. 2, and FIG. 13B is a cross section of a portion corresponding to B-B in FIG. 2. As illustrated in FIGS. 13A and 13B, in a switch element 90 of the second comparative example, the barrier metal layer 16 is provided between the upper wiring line 12 and the ion conductive layer 18. Other structures are the same as those of the first embodiment, so the description is not provided here.

FIGS. 14A to 15D are cross-sectional views illustrating a method for manufacturing the switch element according to the second comparative example. FIGS. 14A to 14C, 15A, and 15B each are a cross section of a portion corresponding to A-A in FIG. 2. FIGS. 14D to 14F, 15C, and 15D each are a cross section of a portion corresponding to B-B in FIG. 2.

Figure 14A:
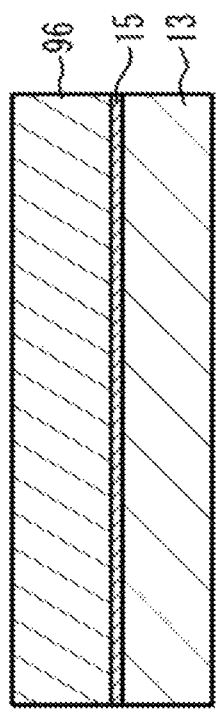
FIGS. 14A to 14F are cross-sectional views (part 1) illustrating a method for manufacturing the switch element according to the second comparative example.
Figure 14B:
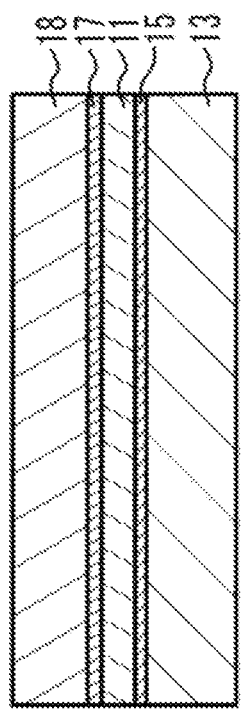
Figure 14C:
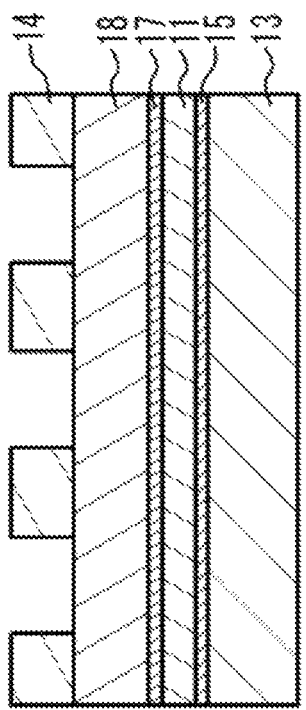
Figure 14D:
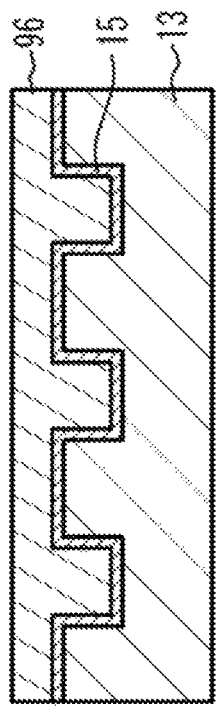

As illustrated in FIGS. 14A and 14D, on the insulating film 13 formed by the CVD method on a substrate (not illustrated), a resist pattern (not illustrated) is formed that includes an opening in a region where the lower wiring line 11 is to be formed. Dry etching is performed on the insulating film 13 with the resist pattern as a mask, to form a plurality of recesses. After the resist pattern is removed, the barrier metal layer 15 that is, for example, a tantalum layer is formed on the insulating film 13 by the sputtering method. Thereafter, a copper film 96 is formed on the barrier metal layer 15 by the electrolytic plating method.

Figure 14E:
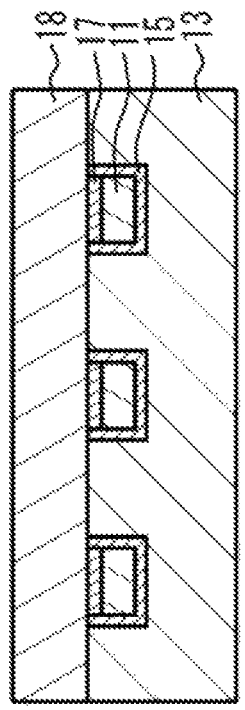

As illustrated in FIGS. 14B and 14E, the copper film 96 and the barrier metal layer 15 are removed until a surface of the insulating film 13 is exposed, by using the CMP method. As a result, the lower wiring line 11 including the copper film 96 embedded in the insulating film 13, and the barrier metal layer 15 interposed between the lower wiring line 11 and the insulating film 13 are formed. The surface of the lower wiring line 11 exposed from the insulating film 13 is oxidized by the plasma oxidation method to form the metal oxide film 17 including copper oxide. Thereafter, the ion conductive layer 18 is formed on the insulating film 13 by the sputtering method.

Figure 14F:
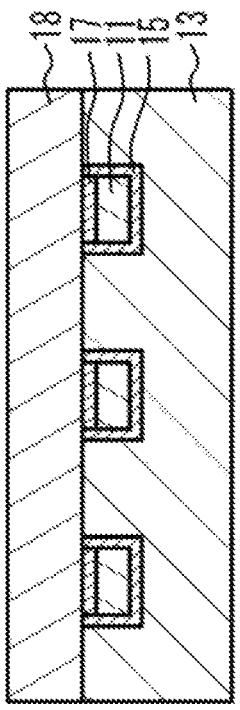

As illustrated in FIGS. 14C and 14F, the insulating film 14 is formed on the ion conductive layer 18 by the CVD method. A recess for forming the upper wiring line 12 is formed in the insulating film 14 by the dry etching method.

Figure 15A:
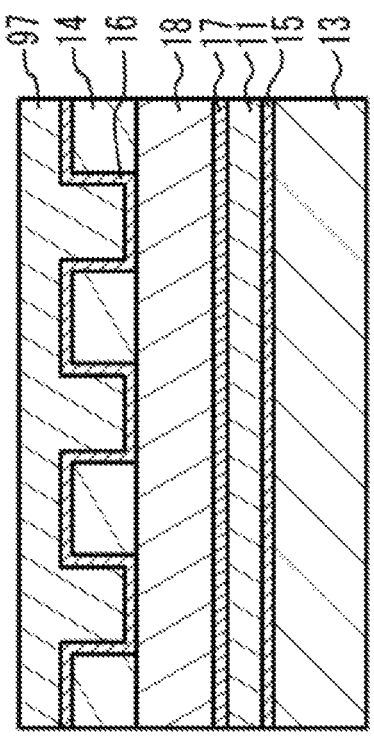
FIGS. 15A to 15D are cross-sectional views (part 2) illustrating the method for manufacturing the switch element according to the second comparative example.
Figure 15B:
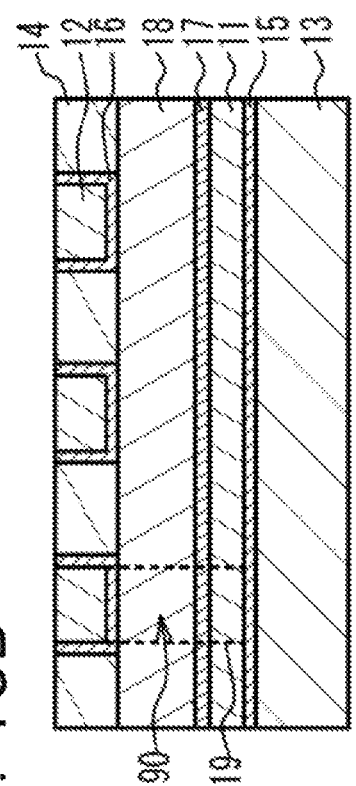
Figure 15C:
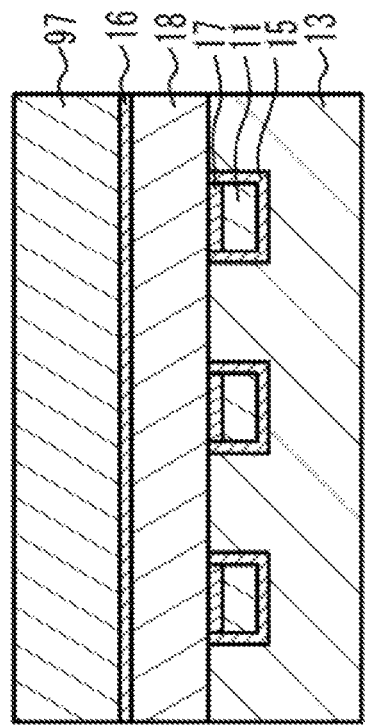

As illustrated in FIGS. 15A and 15C, the barrier metal layer 16 that is, for example, a tantalum layer is formed on the insulating film 14 by the sputtering method. Thereafter, a copper film 97 is formed on the barrier metal layer 16 by the electrolytic plating method.

Figure 15D:
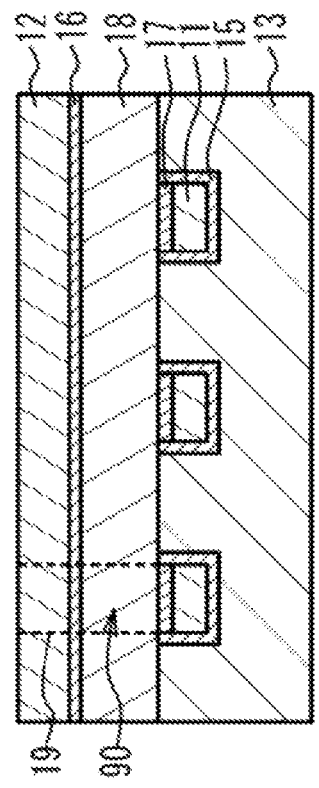

As illustrated in FIGS. 15B and 15D, the copper film 97 and the barrier metal layer 16 are removed until a surface of the insulating film 14 is exposed, by using the CMP method. As a result, the upper wiring line 12 including the copper film 97 embedded in the insulating film 14, and the barrier metal layer 16 interposed between the upper wiring line 12 and the insulating film 14 are formed.

According to the second comparative example, the barrier metal layer 16 is formed between the upper wiring line 12 and the insulating film 14 to suppress that copper atoms contained in the upper wiring line 12 diffuse into the insulating film 14. The barrier metal layer 16 is formed by using the sputtering method as illustrated in FIGS. 15A and 15C. For this reason, as illustrated in FIGS. 13A and 13B, the barrier metal layer 16 is also formed between the upper wiring line 12 and the ion conductive layer 18. Thus, as in the first comparative example, it is desirable to apply a voltage between the lower wiring line 11 and the upper wiring line 12 so that an electric field is generated from the lower wiring line 11 toward the upper wiring line 12, to supply copper ions from the lower wiring line 11 to the ion conductive layer 18. However, in this case, as described in the first comparative example, due to that copper ions remain in the vicinity of the metal oxide film 17 at the interface between the metal oxide film 17 and the ion conductive layer 18, and the like, a good pn junction is not obtained, and the rectification characteristic may degrade.

On the other hand, according to the first embodiment, as illustrated in FIGS. 3A and 3B, in the intersection region 19 where the lower wiring line 11 and the upper wiring line 12 intersect, the upper wiring line 12 is in direct contact with the ion conductive layer 18. For example, in the intersection region 19 where the lower wiring line 11 and the upper wiring line 12 intersect, a barrier metal layer that suppresses diffusion of a metal contained in the upper wiring line 12 is not formed between the upper wiring line 12 and the ion conductive layer 18. For this reason, as illustrated in FIG. 7B, it is possible to form the copper bridge 21 in the ion conductive layer 18 by supplying the copper ions 20 from the upper wiring line 12 to the ion conductive layer 18. As a result, it is possible to set the low resistance state between the lower wiring line 11 and the upper wiring line 12 while suppressing the degradation of the rectification characteristic due to the pn junction formed at the interface between the metal oxide film 17 and the ion conductive layer 18.

As illustrated in FIGS. 4A to 4H, the lower wiring line 11 is formed on the insulating film 13 formed on the first substrate 50, and the metal oxide film 17 is formed on the lower wiring line 11. As illustrated in FIGS. 5A to 5H, the upper wiring line 12 is formed on the insulating film 14 formed on the second substrate 60, and the ion conductive layer 18 is formed on the upper wiring line 12. As illustrated in FIGS. 6A to 6D, the insulating film 13 and the insulating film 14 are bonded to each other with the ion conductive layer 18 sandwiched therebetween so that the upper wiring line 12 is in direct contact with the ion conductive layer 18. As a result, it is possible to form the copper bridge 21 in the ion conductive layer 18 by supplying the copper ions 20 from the upper wiring line 12 to the ion conductive layer 18. Thus, the switch element 10 is obtained that is enabled to set the low resistance state between the lower wiring line 11 and the upper wiring line 12 while suppressing the degradation of the rectification characteristic due to the pn junction formed at the interface between the metal oxide film 17 and the ion conductive layer 18.

Note that, in the first embodiment, as an example, the case has been described where the ion conductive layer 18 in direct contact with the upper wiring line 12 is formed on the insulating film 14, as illustrated in FIGS. 5D and 5I; however, the ion conductive layer 18 may be formed on at least one of the upper wiring line 12 or the metal oxide film 17.

As illustrated in FIGS. 3A and 3B, the insulating film 13 does not include a via connecting the lower wiring line 11 and the ion conductive layer 18 together, and the insulating film 14 does not include a via connecting the upper wiring line 12 and the ion conductive layer 18 together. For this reason, the manufacturing man-hours may be reduced as compared with a case where the via 81 is formed as in the first comparative example. Furthermore, in the case where the via 81 is formed as in the first comparative example, accuracy of a formation position of the via 81 is strict with downsizing of the switch element; however, in the first embodiment, difficulty of the manufacturing is reduced since the via is not formed.

The ion conductive layer 18 is not limited to the one including zirconium nitride, and may include, for example, an oxide, nitride, or oxynitride of a transition metal, or may include an oxide, nitride, or oxynitride of a refractory metal having a melting point higher than that of iron. The ion conductive layer 18 may include an oxide, nitride, or oxynitride of at least one of copper, zirconium, titanium, nickel, tantalum, hafnium, tungsten, vanadium, zinc, or lithium.

Even in this case, the region 18a near the interface with the metal oxide film 17 of the ion conductive layer 18 is oxidized to form an n-type semiconductor. Thus, a pn junction is formed at the interface between the metal oxide film 17 and the ion conductive layer 18, and a rectifying action is obtained. In such a diode, a good rectification characteristic is obtained as described in FIG. 9.

The ion conductive layer 18 has a lower effect of suppressing the diffusion of the metal contained in the upper wiring line 12 than the barrier metal layer 16 formed between the upper wiring line 12 and the insulating film 14. For example, even when the ion conductive layer 18 includes a first material enabled to suppress the diffusion of the metal contained in the upper wiring line 12, the ion conductive layer 18 has a lower film density and/or a higher oxygen concentration in the film as compared with the barrier metal layer 16 including the first material. For example, the ion conductive layer 18 may have a columnar crystal structure. As described above, the ion conductive layer 18 has a lower effect of suppressing the diffusion of the metal than the barrier metal layer 16, so that the copper ions 20 are easily supplied from the upper wiring line 12 into the ion conductive layer 18, and the copper bridge 21 may be formed in the ion conductive layer 18.

The ion conductive layer 18 may include, for example, an organic compound such as an imide-based or fluororesin-based, or a silicon compound such as silicon oxide (SiO). The ion conductive layer 18 may include any material as long as it is an insulating layer enabled to conduct metal ions. When the ion conductive layer 18 includes an organic compound or a silicon compound, a Schottky junction between the lower wiring line 11 and the metal oxide film 17 provides a diode element having a rectifying action. Note that, even in this case, when copper ions are supplied from the lower wiring line 11 to the ion conductive layer 18, the residual copper ion concentration in the metal oxide film 17 is high, a good Schottky junction is not obtained, and the rectification characteristic may degrade; however, according to the first embodiment, the degradation of the rectification characteristic may be suppressed.

The case has been described where the metal oxide film 17 includes copper oxide, as an example; however, if the metal oxide film 17 is provided between the lower wiring line 11 and the ion conductive layer 18, and a rectifying action is obtained, the metal oxide film 17 may include another material. When the metal oxide film 17 includes copper oxide, the copper oxide and the metal may form a Schottky junction, so that the metal oxide film 17 and the lower wiring line 11 may provide a rectifying action. Furthermore, since copper oxide is a p-type semiconductor, a pn junction is easily formed at the interface between the metal oxide film 17 and the ion conductive layer 18, and a rectifying action due to this is easily obtained.

The case has been described where both the lower wiring line 11 and the upper wiring line 12 include copper, as an example; however, the present embodiment is not limited to the case. The upper wiring line 12 may include copper or aluminum from a point of lowering resistance and supplying metal ions to the ion conductive layer 18. The lower wiring line 11 may include the same material as the upper wiring line 12, or may include a different material. The lower wiring line 11 may include copper or aluminum from a point of lowering resistance.

Second Embodiment

Figure 16A:
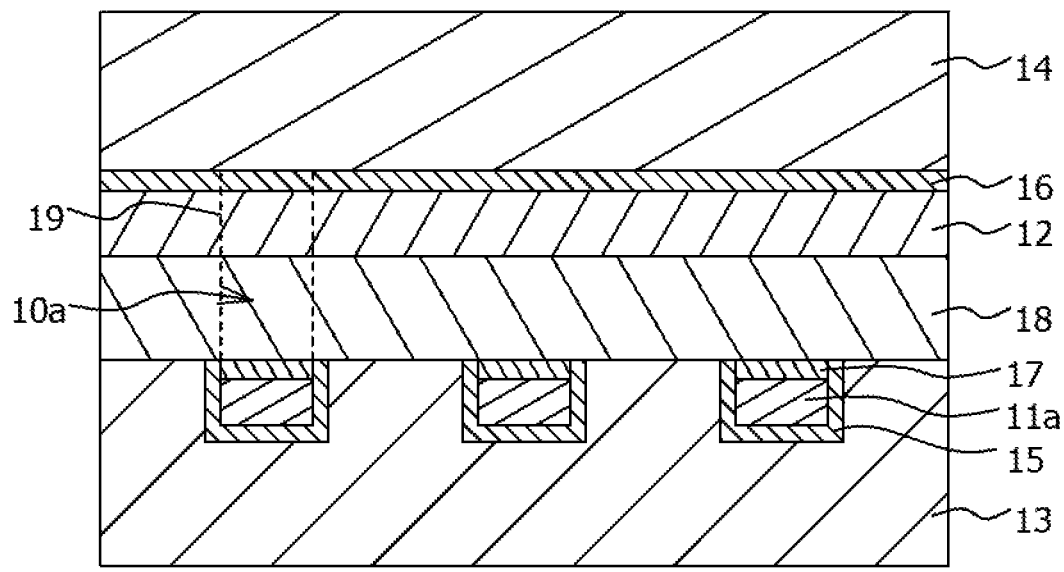
FIGS. 16A and 16B are cross-sectional views illustrating a switch element according to a second embodiment.
Figure 16B:
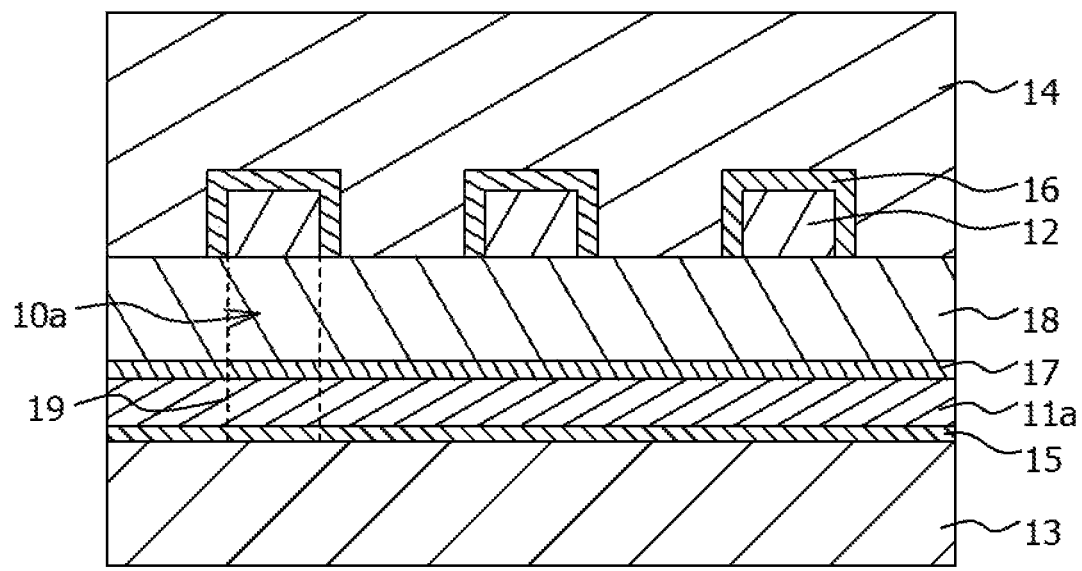

FIGS. 16A and 16B are cross-sectional views illustrating a switch element according to a second embodiment FIG. 16A is a cross section of a portion corresponding to A-A in FIG. 2, and FIG. 16B is a cross section of a portion corresponding to B-B in FIG. 2. As illustrated in FIGS. 16A and 16B, in a switch element 10a of the second embodiment, the upper wiring line 12 includes copper, while a lower wiring line 11a includes platinum. Other structures are the same as those of the first embodiment, so the description is not provided here.

FIGS. 17A to 18D are cross-sectional views illustrating a method for manufacturing the switch element according to the second embodiment. FIGS. 17A to 17C, 18A, and 18B each are a cross section of a portion corresponding to A-A in FIG. 2. FIGS. 17D to 17F, 18C, and 18D each are a cross section of a portion corresponding to B-B in FIG. 2.

Figure 17A:
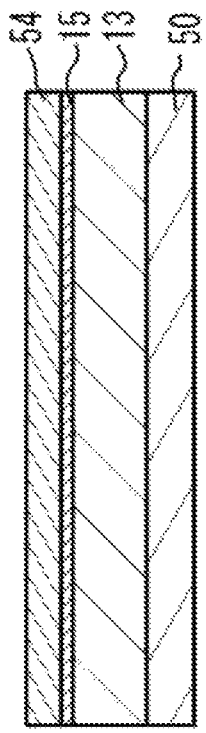
FIGS. 17A to 17F are cross-sectional views (part 1) illustrating a method for manufacturing the switch element according to the second embodiment.
Figure 17B:
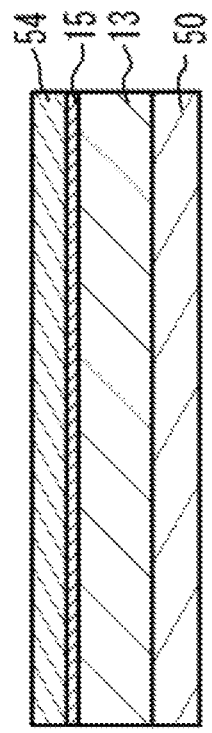
Figure 17C:
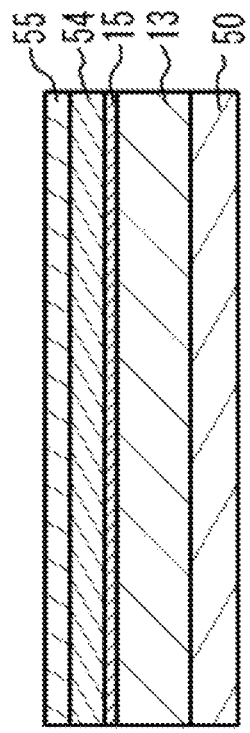
Figure 17D:
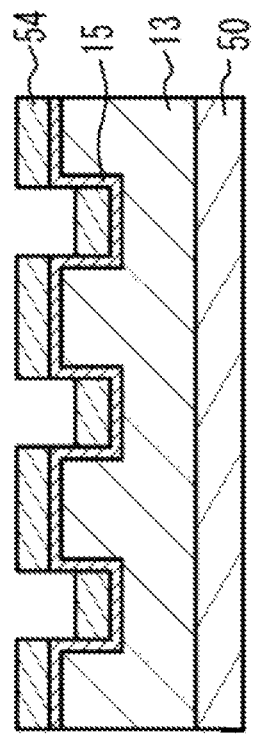

As illustrated in FIGS. 17A and 17D, a plurality of recesses is formed in a region where the lower wiring line 11 is formed in the insulating film 13 formed on the first substrate 50 by the CVD method. After the recess is formed, the barrier metal layer 15 is formed on the insulating film 13 by the sputtering method. Then, a platinum film 54 is formed on the barrier metal layer 15 by a vacuum evaporation method. At this time, the platinum film 54 is formed by adjusting the time so that the recess is not completely filled with the platinum film 54.

Figure 17E:
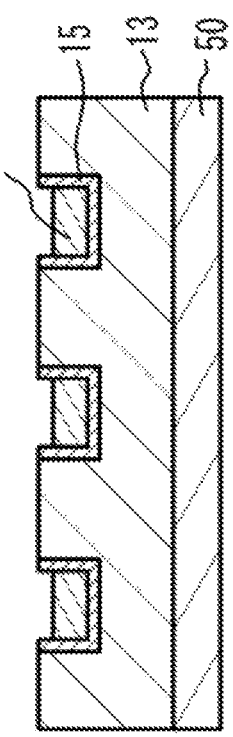

As illustrated in FIGS. 17B and 17E, the platinum film 54 and the barrier metal layer 15 are removed until a surface of the insulating film 13 is exposed, by using the CMP method.

Figure 17F:
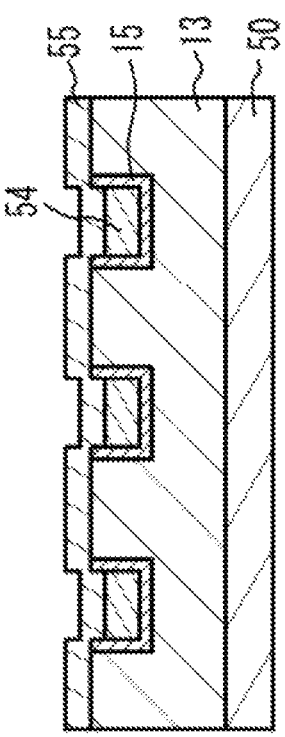

As illustrated in FIGS. 17C and 17F, a copper film 55 is formed on the insulating film 13 by the sputtering method. At this time, the copper film 55 is formed so that the recess is completely filled.

Figure 18A:
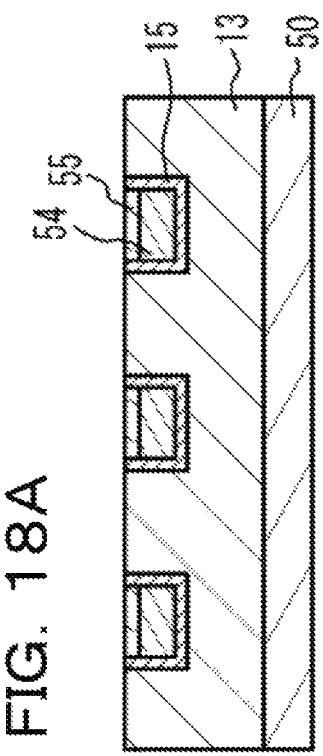
FIGS. 18A to 18D are cross-sectional views (part 2) illustrating the method for manufacturing the switch element according to the second embodiment.
Figure 18B:
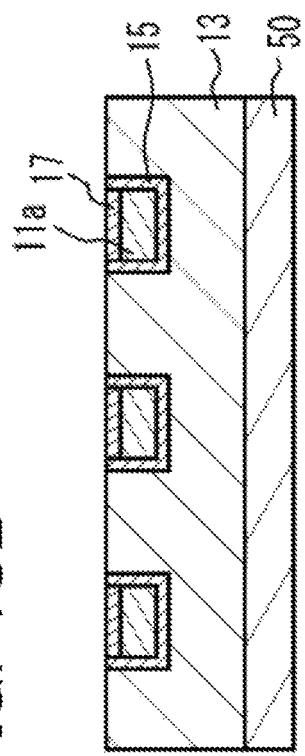
Figure 18C:
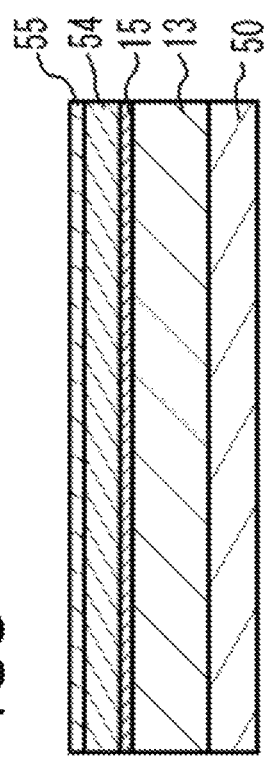

As illustrated in FIGS. 18A and 18C, the copper film 55 is removed until a surface of the insulating film 13 is exposed, by using the CMP method. As a result, the platinum film 54 and the copper film 55 laminated thereon are formed in the recess of the insulating film 13.

Figure 18D:
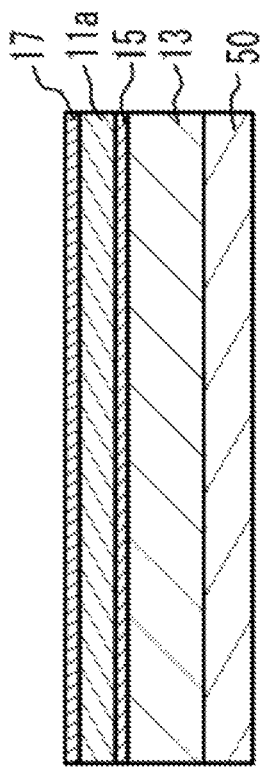

As illustrated in FIGS. 18B and 18D, the copper film 55 exposed from the insulating film 13 is oxidized by the plasma oxidation method. As a result, the lower wiring line 11a including the platinum film 54 embedded in the insulating film 13, and the metal oxide film 17 including copper oxide formed on the lower wiring line 11a are formed. Thereafter, the steps described with reference to FIGS. 5A to 6D of the first embodiment are performed.

Figure 19A:
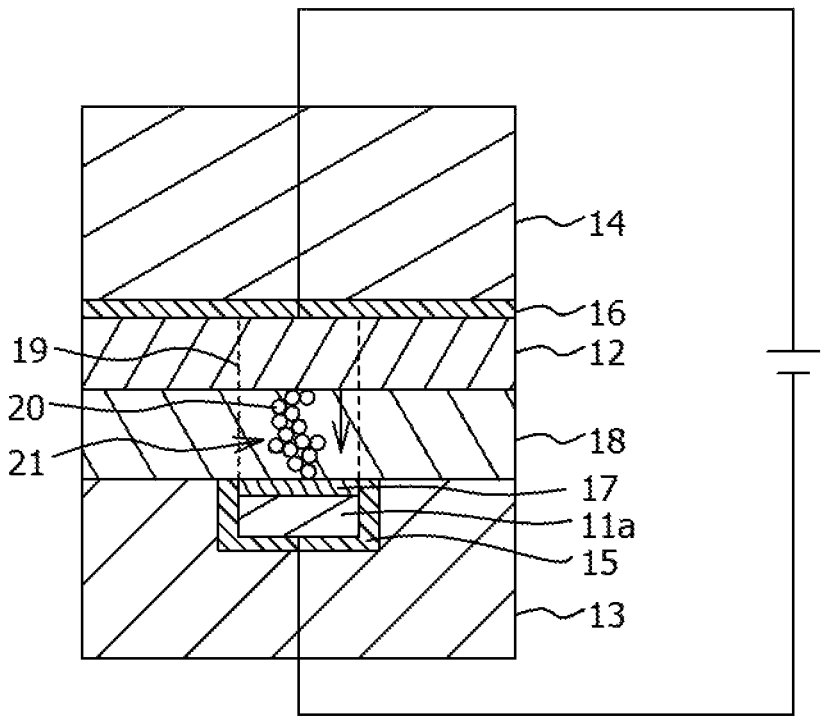
FIGS. 19A and 19B are cross-sectional views illustrating that the switch element according to the second embodiment functions as a resistance change element.
Figure 19B:
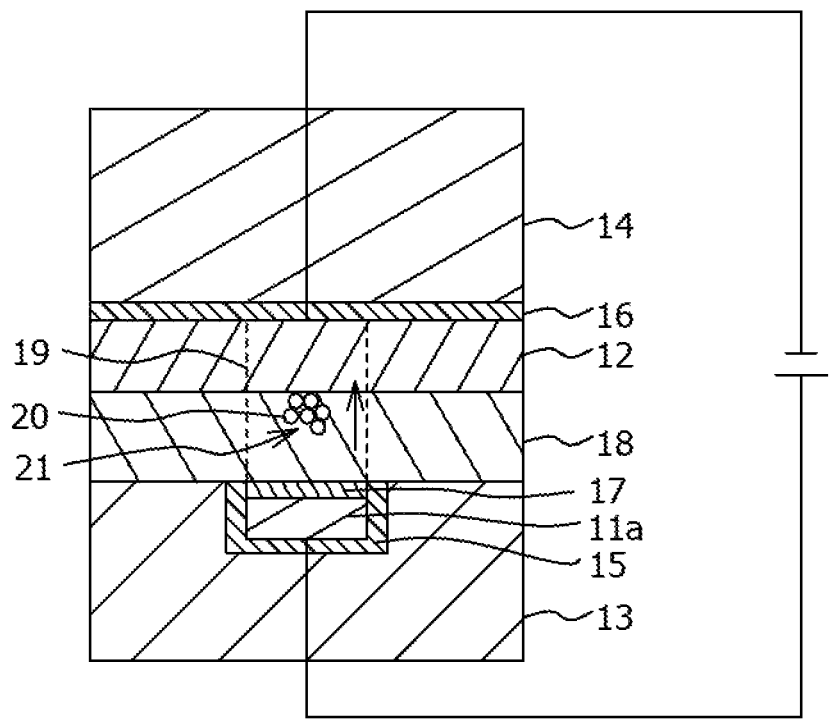

FIGS. 19A and 19B are cross-sectional views illustrating that the switch element according to the second embodiment functions as a resistance change element. As illustrated in FIG. 19A, a voltage positive with respect to the lower wiring line 11a is applied to the upper wiring line 12 so that an electric field is generated from the upper wiring line 12 toward the lower wiring line 11a. As a result, the copper ions 20 are supplied from the upper wiring line 12 to the ion conductive layer 18, the copper bridge 21 is formed in the ion conductive layer 18, and the resistance between the lower wiring line 11a and the upper wiring line 12 is set in the low resistance state.

As illustrated in FIG. 19B, a voltage negative with respect to the lower wiring line 11a is applied to the upper wiring line 12 so that an electric field is generated from the lower wiring line 11a toward the upper wiring line 12. As a result, the copper ions 20 forming the copper bridge 21 in the ion conductive layer 18 move to the upper wiring line 12 and part of the copper bridge 21 is cut off. Furthermore, platinum forming the lower wiring line 11a is a metal having a lower ionization tendency than that of copper forming the upper wiring line 12. For this reason, even if the electric field is generated from the lower wiring line 11a toward the upper wiring line 12, it is difficult for platinum ions to be supplied from the lower wiring line 11a to the ion conductive layer 18. Thus, it is difficult to form a bridge in which platinum ions are deposited as a metal in the ion conductive layer 18. Thus, the resistance between the lower wiring line 11a and the upper wiring line 12 is set in the high resistance state. As described above, the switch element 10a functions as a memory that records data "1" or "0" by the fact that the resistance between the lower wiring line 11a and the upper wiring line 12 is set in the high resistance state or the low resistance state. The data is read by applying a forward bias to the diode element using the metal oxide film 17 and setting a voltage between the lower wiring line 11a and the upper wiring line 12 at this time to be smaller than a voltage when the bridge is cut in FIG. 19B.

According to the second embodiment, the lower wiring line 11a and the upper wiring line 12 include respective materials different from each other. For example, a portion in contact with at least the metal oxide film 17 of the lower wiring line 11a includes a material different from that of the upper wiring line 12. As a result, as illustrated in FIGS. 19A and 19B, by controlling an application direction of a voltage between the lower wiring line 11a and the upper wiring line 12, the resistance between the lower wiring line 11a and the upper wiring line 12 may be repeatedly switched between the low resistance state and the high resistance state. Thus, writing and erasing of data, and on/off control of the switch may be repeatedly executed.

As illustrated in FIG. 19B, to switch the resistance between the lower wiring line 11a and the upper wiring line 12 to the high resistance state, an electric field is caused to generate from the lower wiring line 11a toward the upper wiring line 12. In this case, to suppress that metal ions are supplied from the lower wiring line 11a to the ion conductive layer 18 and a metal bridge is formed, the lower wiring line 11a preferably includes a metal having a lower ionization tendency than that of the upper wiring line 12. For example, a portion in contact with at least the metal oxide film 17 of the lower wiring line 11a preferably includes a metal having a lower ionization tendency than that of the upper wiring line 12. For example, the lower wiring line 11a preferably includes gold, platinum, silver, rhodium, iridium, or ruthenium from a point of suppressing the supply of metal ions to the ion conductive layer 18. The upper wiring line 12 preferably includes copper or aluminum from a point of lowering resistance and supplying metal ions to the ion conductive layer 18.

Figure 20A:
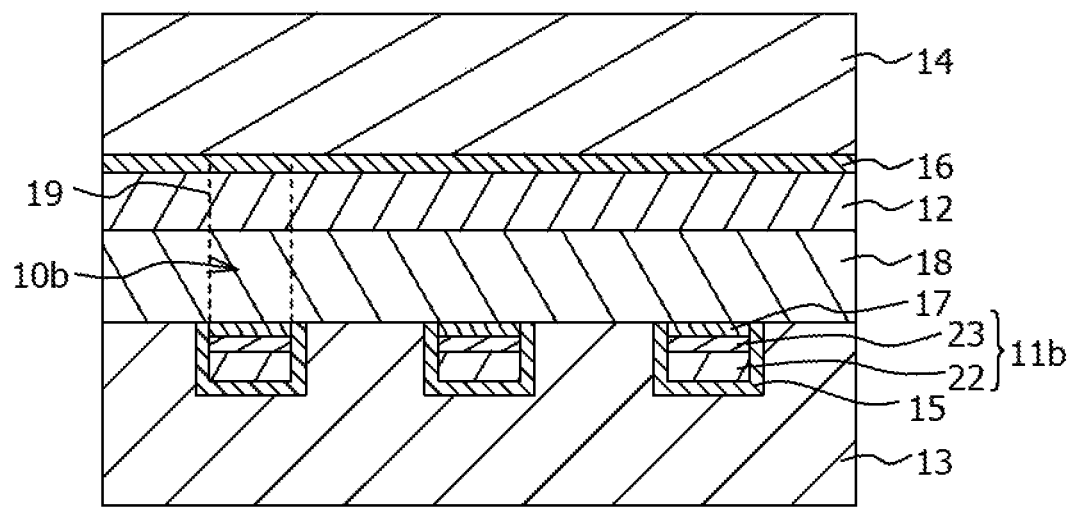
FIGS. 20A and 20B are cross-sectional views illustrating a switch element according to a first modification of the second embodiment.
Figure 20B:
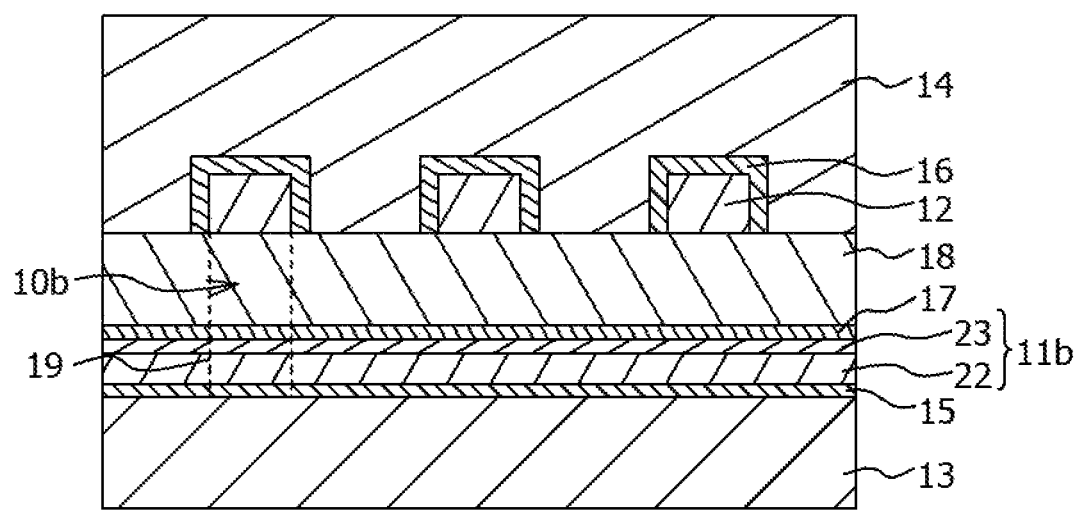

FIGS. 20A and 20B are cross-sectional views illustrating a switch element according to a first modification of the second embodiment. FIG. 20A is a cross section of a portion corresponding to A-A in FIG. 2, and FIG. 20B is a cross section of a portion corresponding to B-B in FIG. 2. As illustrated in FIGS. 20A and 20B, in a switch element 10b of the first modification of the second embodiment, a lower wiring line 11b includes a first layer 22 including copper, and a second layer 23 including platinum laminated on the first layer 22. The second layer 23 has a thickness of a degree that may suppress that copper ions contained in the first layer 22 is supplied to the ion conductive layer 18 when a voltage that generates an electric field from the lower wiring line 11b toward the upper wiring line 12 is applied between the lower wiring line 11b and the upper wiring line 12. The thickness of the second layer 23 is, for example, about 10 nm to 100 nm, and is 50 nm as an example. Other structures are the same as those of the first embodiment, so the description is not provided here. Furthermore, the switch element 10b according to the first modification of the second embodiment may be manufactured by a method similar to that for manufacturing the switch element 10a of the second embodiment, so the description of the manufacturing step is not provided here.

Also in the first modification of the second embodiment, a portion in contact with at least the metal oxide film 17 of the lower wiring line 11b is the second layer 23 including a material different from that of the upper wiring line 12. For this reason, by controlling an application direction of a voltage between the lower wiring line 11b and the upper wiring line 12, the resistance between the lower wiring line 11b and the upper wiring line 12 may be repeatedly switched between the low resistance state and the high resistance state.

The second layer 23 that is a portion in contact with the metal oxide film 17 of the lower wiring line 11b preferably includes a metal having a lower ionization tendency than that of the upper wiring line 12 to suppress that metal ions are supplied from the lower wiring line 11b to the ion conductive layer 18 and a metal bridge is formed. For example, the second layer 23 of the lower wiring line 11b preferably includes platinum, gold, silver, rhodium, iridium, or ruthenium from a point of suppressing the supply of metal ions to the ion conductive layer 18. The first layer 22 preferably includes copper or aluminum from a point of lowering resistance. The upper wiring line 12 preferably includes copper or aluminum from a point of lowering resistance and supplying metal ions to the ion conductive layer 18.

Although the embodiments have been described in detail above, the embodiments are not limited to such specific embodiments, and various modifications and alternations may be made within the scope of the gist of the embodiments described in the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A switch element comprising:
    a first wiring line that is provided in a first insulating film and extends in a first direction;
    a second wiring line that is provided in a second insulating film and extends in a second direction that intersects the first direction;
    an ion conductive layer sandwiched between the first wiring line and the second wiring line and directly in contact with the second wiring line in an intersection region where the first wiring line and the second wiring line intersect, and enabled to conduct metal ions supplied from the second wiring line; and
    a metal oxide film sandwiched between the first wiring line and the ion conductive layer.

2. The switch element according to claim 1, wherein
    the first wiring line includes, in a portion in contact with the metal oxide film, gold, platinum, silver, rhodium, iridium, or ruthenium, and includes, in a portion other than the portion in contact with the metal oxide film, copper or aluminum, and the second wiring line includes copper or aluminum.

3. The switch element according to claim 1, wherein
the first wiring line includes gold, platinum, silver, rhodium, iridium, or ruthenium, and
the second wiring line includes copper or aluminum.

4. The switch element according to claim 1, further comprising a pn junction at an interface between the ion conductive layer and the metal oxide film.

5. The switch element according to claim 1, wherein the ion conductive layer includes an oxide, nitride, or oxynitride of at least one of copper, zirconium, titanium, nickel, tantalum, hafnium, tungsten, vanadium, zinc, or lithium.

6. The switch element according to claim 1, wherein the metal oxide film includes copper oxide.

7. A switch element comprising:
a first wiring line that is provided in a first insulating film and extends in a first direction;
a second wiring line that is provided in a second insulating film and extends in a second direction that intersects the first direction;
an ion conductive layer sandwiched between the first wiring line and the second wiring line in an intersection region where the first wiring line and the second wiring line intersect, and enabled to conduct metal ions supplied from the second wiring line; and
a metal oxide film sandwiched between the first wiring line and the ion conductive layer, wherein
a barrier metal layer that suppresses diffusion of a metal contained in the second wiring line is not provided between the second wiring line and the ion conductive layer.

8. The switch element according to claim 7, wherein
the first wiring line includes, in a portion in contact with the metal oxide film, gold, platinum, silver, rhodium, iridium, or ruthenium, and includes, in a portion other than the portion in contact with the metal oxide film, copper or aluminum, and
the second wiring line includes copper or aluminum.

9. The switch element according to claim 7, wherein
the first wiring line includes gold, platinum, silver, rhodium, iridium, or ruthenium, and
the second wiring line includes copper or aluminum.

10. The switch element according to claim 7, further comprising a pn junction at an interface between the ion conductive layer and the metal oxide film.

11. The switch element according to claim 7, wherein the ion conductive layer includes an oxide, nitride, or oxynitride of at least one of copper, zirconium, titanium, nickel, tantalum, hafnium, tungsten, vanadium, zinc, or lithium.

12. The switch element according to claim 7, wherein the metal oxide film includes copper oxide.

13. A method for manufacturing a switch element, comprising:
forming a first wiring line on a first insulating film formed on a first substrate;
forming a second wiring line on a second insulating film formed on a second substrate different from the first substrate;
forming a metal oxide film on the first wiring line;
forming an ion conductive layer enabled to conduct metal ions on at least one of the second wiring line or the metal oxide film; and
bonding the first insulating film and the second insulating film to each other with the ion conductive layer sandwiched therebetween to cause the second wiring line to be in direct contact with the ion conductive layer.

14. The method for manufacturing a switch element according to claim 13, wherein in the forming the metal oxide film, the metal oxide film is formed by oxidizing the first wiring line or a metal layer formed on the first wiring line.

* * * * *